United States Patent

Sakurai et al.

[11] Patent Number: 5,905,690
[45] Date of Patent: May 18, 1999

[54] SYNCHRONOUS SEMICONDUCTOR DEVICE HAVING CIRCUITRY CAPABLE OF SURELY RESETTING TEST MODE

[75] Inventors: Mikio Sakurai; Susumu Tanida; Yasuhiko Tsukikawa; Masaya Nakano; Takahiko Fukiage, all of Hyogo, Japan

[73] Assignee: Mitsubishi Denki Kabushiki Kaisha, Tokyo, Japan

[21] Appl. No.: 09/058,987

[22] Filed: Apr. 13, 1998

[30] Foreign Application Priority Data

Nov. 14, 1997 [JP] Japan ................................. 9-313739

[51] Int. Cl.[6] ....................................................... G11C 8/00
[52] U.S. Cl. ............................................. 365/233; 365/201
[58] Field of Search ..................................... 365/201, 200, 365/233, 230.03

[56] References Cited

U.S. PATENT DOCUMENTS 5,572,470  11/1996  McClure et al. ......................... 365/200

FOREIGN PATENT DOCUMENTS 8-111089  4/1996  Japan .

Primary Examiner—David Nelms
Assistant Examiner—David Lam
Attorney, Agent, or Firm—McDermott, Will & Emery

[57] ABSTRACT

A reset signal generating circuit in a synchronous semiconductor memory device outputs a reset signal ZPOR1 in response to a power on reset signal ZPOR generated immediately after power on and an initialize command (for example, a precharge command) executed for initialization after power on. A test mode register included in a mode setting circuit receives as a reset signal, the reset signal ZPOR1. Consequently, a test mode signal output attains to an NOP state, or output of the test mode signal is stopped.

15 Claims, 27 Drawing Sheets

DECODER D1

REGISTER R1

SYNCHRONOUS SEMICONDUCTOR DEVICE HAVING CIRCUITRY CAPABLE OF SURELY RESETTING TEST MODE

BACKGROUND OF THE INVENTION

1. Field of the Invention

The present invention relates to a synchronous semiconductor memory device and, more specifically, to a synchronous semiconductor memory device in which a test mode is reset at the time of power on.

2. Description of the Background Art

In a synchronous semiconductor memory device developed in order to attain high speed accessing, operations (instructions) necessary for data reading or writing are all performed in synchronization with a clock (external clock signal) applied externally with a stable period.

A conventional synchronous semiconductor memory device will be described with reference to FIG. 21. A synchronous semiconductor memory device 9000 shown in FIG. 21 includes a control signal buffer 101, an internal clock generating circuit 102, an address buffer 103, a mode setting circuit 104, an act generating circuit 106, a precharge generating circuit 105, a POR generating circuit 100 and a plurality of banks (in FIG. 21, banks B0, B1, B2 and B3).

Banks B0, B1, B2 and B3 each include a row system control circuit, a word driver, a sense amplifier and an IO gate, not shown. Each bank is capable of activating a word line, reading data, writing data and inactivating a word line, independent from each other.

The memory cell array, not shown, includes a plurality of memory cells arranged in a matrix of rows and columns, and each memory cell is connected to a crossing between a word line provided corresponding to the row direction and a bit line pair provided corresponding to the column direction.

Control signal buffer 101 receives external control signals (external row address strobe signal /RAS, external column address strobe signal /CAS, external write enable signal /WE and so on), and outputs corresponding internal control signals. In the following description, internal control signals ZCS, ZRAS, ZCAS and ZWE denote internal signals corresponding to and in phase with an external chip select signal /CS, external row address strobe signal /RAS, external column address strobe signal /CAS and external write enable signal /WE, which are external control signals, respectively. Internal control signals CS, RAS, CAS and WE denote internal signals of opposite phase to internal control signals ZCS, ZRAS, ZCAS and ZWE, respectively.

Internal clock generating circuit 102 takes in an external clock signal EXTCLK and outputs an internal clock signal CLK for controlling internal operation.

Address buffer 103 takes in an externally applied external address signal A and outputs an address signal (which will be referred to as ADD0, ADD1, . . . , ADD7). The external address signal A includes a row address signal and a column address signal time divisionally multiplexed. Further, address buffer 103 includes a bank address decoder, not shown, which decodes the address signal A and outputs a bank decode signal designating a corresponding bank.

Act generating circuit 106 outputs an act start signal for activating a designated bank, in response to an externally input act command. Precharge generating circuit 105 outputs a precharge start signal for inactivating a designated bank, in response to an externally input precharge command.

Mode setting circuit 104 sets a specific operation mode or a test mode in response to an external signal, which will be described later. Thus, it is possible to set various operation modes or test modes including a CAS latency CL and burst length BL.

POR generating circuit 100 outputs, for a prescribed period after power on, a power on reset signal ZPOR based on an external power supply voltage EXTVDD. Mode setting circuit 104 is reset upon reception of the power on reset signal ZPOR.

Normal operation of the conventional synchronous semiconductor memory device 9000 shown in FIG. 21 from power on until it enters idle state will be described with reference to a timing chart of FIG. 22.

In FIG. 22, (A) represents internal clock signal CLK, (B) represents an internal control signal (clock enable signal) CKE, (C) represents internal control signal ZCS, (D) represents internal control signal ZRAS, (E) represents internal control signal ZCAS and (F) represents internal control signal ZWE, respectively. Further, (G) represents address signal A, (H) represents bank decode signal BA, (I) represents power supply voltage EXTVDD, and (J) represents power on reset signal ZPOR, respectively.

After power on (time t0), power supply voltage EXTVDD rises. At a time point (time t1) when external power supply voltage EXTVDD attains to a prescribed level, the power on reset signal ZPOR is output from POR generating circuit 100, and the synchronous semiconductor memory device is internally reset.

Thereafter, a stable clock state of 200 $\mu$s is kept, so that internal voltage system is stabilized. Thereafter, a precharge all command PREA (specified by internal control signals ZRAS and ZWE at the L level and internal control signal ZCAS at the H level) is executed on all the banks. After the lapse of a tRP period (normally, 30 ns), an auto refresh command REFA (specified by internal control signals ZRAS and ZCAS at the L level and internal control signal ZWE at the H level) is executed eight times or more with the cycle of tRC period (normally, 80 ns).

Thereafter, a mode register set command MRS (specified by setting internal control signals ZRAS, ZCAS and ZWE to the L level and by inputting address signal A) is input, so that an operation mode of a circuit such as CAS latency CL or burst length BL is set.

Mode setting circuit 104 which operates in response to the mode register set command will be briefly described with reference to FIG. 23.

The conventional mode setting circuit 104 shown in FIG. 23 includes a mode detecting circuit 115, a normal mode setting circuit 124 and a test mode setting circuit 125.

Normal mode setting circuit 124 includes a normal mode register 116 and a normal mode decoder 117. Test mode setting circuit 125 includes a test mode register 118 and a test mode decoder 119.

Mode detecting circuit 115 is responsive to the mode register set command and address signal ADD7 and outputs a signal for operating a normal mode register 116 or a test mode register 118, which will be described later. Address signal ADD7 is a key signal for entering the test mode.

Here, the test mode refers to an operation mode employed for efficiently evaluating and analyzing the synchronous semiconductor memory device, and it is set by a procedure which is not used in actual use (more specifically, address signal ADD7 is fixed at the L level).

Normal mode setting circuit 124 outputs various mode signals (CAS latency CL, burst length BL, . . . ) in response to address signals ADD0, . . . , ADD6 at the time of input of the mode register set command.

Test mode setting circuit 125 outputs various test mode signals in response to address signals ADD0, ADD1 and ADD7 at the time of input of the mode register set command.

Here, when the address signal ADD7 is at the L level, address signals ADD0, . . . , ADD6 will be a decode signal for selecting a specific one mode among a plurality of normal modes. When address signal ADD7 is at the H level, address signals ADD0 and ADD1 will be a decode signal for selecting any one of a plurality of test modes.

Structure of the mode detecting circuit 115 will be briefly described with reference to FIG. 24.

Referring to FIG. 24, mode detecting circuit 115 includes an NAND circuit 1, NOR circuits 2 and 5, and inverter circuits 3, 4, 6 and 7. When input of the mode register set command (specified by internal control signals CS, RAS, CAS and WE at the H level) is detected, NAND circuit 1 outputs a signal MR which is at the L level.

NOR circuit 2 receives at its inputs the signal MR and address signal ADD7. NOR circuit 5 receives at its inputs the signal MR and the ground potential.

Inverter circuit 3 inverts an output signal from NOR circuit 2, and outputs an inverted normal mode set signal ZSNM. Inverter circuit 4 inverts the inverted normal mode set signal ZSNM, and outputs a normal mode set signal SNM.

Inverter circuit 6 inverts an output signal from NOR circuit 5 and outputs an inverted test mode set signal ZSTM. Inverter circuit 7 inverts the inverted test mode set signal ZSTM and outputs a test mode set signal STM.

A register constituting normal mode register 116 and test mode register 118 will be described with reference to FIG. 25.

A register R1 shown in FIG. 25 is a latch type register and it includes inverter circuits 11, 12 and 13, gate circuits 14 and 15, and an NOR circuit 16.

Inverter circuit 11 inverts a signal at input node N1 and outputs the inverted signal to NOR circuit 16. Gate circuit 14 inverts, in response to signals at input nodes N3 and N4, a signal received from input node N2 and outputs the inverted signal to node Z1. NOR circuit 16 receives signals from inverter circuit 11 and node Z1. Gate circuit 15 inverts, in response to signals at input nodes N3 and N4, an output signal from NOR circuit 16 and outputs the result to node Z1. Inverter circuit 12 inverts the signal at node Z1 and outputs the result to output node N5. Inverter circuit 13 inverts an output signal from inverter circuit 12 and outputs the result to output node N6.

Normal mode register 116 includes resistors R1 corresponding to address signals ADD0, . . . , ADD6, respectively. Register R1 corresponding to address signal ADDi (where i=0, . . . , 6) receives at an input node N1, the power on reset signal ZPOR and at input node N2, the corresponding address signal ADDi. Further, the register receives at an input node N3, the inverted normal mode set signal ZSNM, and at input node N4, the normal mode set signal SNM. A signal NADDi is output from an output node N5, and its inverted signal, an inverted signal ZNADDi is output from an output node N6 (hereinafter the signals will be generally referred to as NADDi and inverted signal ZNADD).

Test mode register 118 includes registers R1 corresponding to address signals ADD0 and ADD1, respectively. Register R1 corresponding to address signal ADDi (where i=0, 1) receives at input node N1, the power on reset signal ZPOR, and at input node N2, the corresponding address signal ADDi. Further, the register R1 receives at input node N3, the inverted test mode set signal ZSTM, and at input node N4, receives the test mode set signal STM. A signal TADDi is output from output node N5, and its inverted signal, an inverted signal ZTADDi is output from output node N6 (hereinafter, these signals will be generally referred to as signal TADD and inverted signal ZTADD).

Further, test mode register 118 includes a register corresponding to address signal ADD7. The register corresponding to address signal ADD7 has the same circuit structure as register R1 shown in FIG. 25, with an inverter circuit 13 (output node N6) removed (hereinafter, the register will be referred to as register R2). Register R2 receives, at input node N1, the power on reset signal ZPOR, at input node N2, address signal ADD7, at input node N3, inverted test mode set signal ZSTM and at input node N4, test mode set signal STM. Test mode enable signal TME is output from output node N5 of register R2.

Structure of the test mode decoder 119 will be briefly described with reference to FIG. 26.

Test mode decoder 119 shown in FIG. 26 includes NAND circuits 21, 22, 23 and 24, and inverter circuits 25, 26, 27 and 28. The signal TADD, inverted signal ZTADD and test mode enable signal TME output from test mode register 118 are input to respective input nodes of NAND circuits 21, . . . , 24. Test mode signals TM1, TM2, TM3 and TM4 are output from inverter circuits 25, 26, 27 and 28, respectively.

Normal mode decoder 117 has the same structure as test mode decoder 119 and outputs a mode signal in response to a combination of the signal NADD and the inverted signal ZNADD output from normal mode register 116.

Relation between operations of normal mode setting circuit 124 and test mode setting circuit 125 will be described with reference to the timing chart of FIG. 27.

In FIG. 27, (A) represents internal clock signal CLK, (B) represents internal control signal CS, (C) represents internal control signal RAS, (D) represents internal control signal CAS, (E) represents internal control signal WE, (F) represents address signal ADD7, (G) represents normal mode set signal SNM and (H) represents test mode set signal STM.

As shown in FIG. 27, if address signal ADD7 is at the H level when mode register set command MRS is input (time t0), test mode set signal STM attains to the H level while the normal mode set signal SNM is at the L level, and therefore test mode register 118 is set while the content of normal mode register 116 is protected.

If address signal ADD7 is at the H level when mode register set command MRS is input (time t1), normal mode set signal SNM and test mode set signal STM both attain to the H level. In this case, inlet of register R1 of normal mode register 116 is opened, and addresses ADD0, . . . , ADD6 are taken in. Thus, the signal NADD and the inverted signal ZNADD are generated. As shown in the circuit diagram, normal mode register 116 is a latch type circuit, and taking of a signal is performed only by the mode register set command.

The address signals which are taken in are decoded by normal mode decoder 117 and provide information related to mode signal BL, CL and so on. Meanwhile, since address signal ADD7 at the L level is taken in by register R2, test mode enable signal TME is reset, and the test mode is reset (exit).

In actual use (normal mode), address signal ADD7 is fixed at the L level when mode register set command is input, so that entrance to test mode is prevented.

As described above, the conventional synchronous semiconductor memory device 9000 includes a test mode setting circuit 125 for testing before delivery, and in the actual use, power on reset signal ZPOR is used for resetting, so as to prevent erroneous entrance to the test mode.

The power on reset signal ZPOR, however, may not sufficiently be generated at the time of power on, dependent on the condition of rise of the power supply. Therefore, resetting by the power on reset signal ZPOR signal is not very reliable.

Meanwhile, the conventional semiconductor memory device 9000 includes normal mode setting circuit 124 and test mode setting circuit 125, and operations of these circuits are controlled by combination of address signals at the time of input of the mode register set command. Though the combinations of the addresses are not open in the actual use, it is possible that the test mode is erroneously entered if the reset should be insufficient.

In fact, there are computer systems which support both EDO DRAM (Extended Data Out Dynamic Random Access Memory) and the synchronous semiconductor memory device. In such a system, it is possible that an unnecessary signal is applied to the synchronous semiconductor memory device in an operation of checking the memory.

Therefore, there still remains possibility of erroneous entrance to the test mode in the actual use. Therefore, in the conventional synchronous semiconductor memory device 9000, the test mode is reset by the mode register set command in the normal mode. However, when the test mode involves variation in internal potential, a time period of at least several hundreds ns is necessary from the cancellation of the test mode until the internal voltage returns to the set value. Therefore, if an operation instruction such as an act command is input to the synchronous semiconductor memory device 9000 immediately after the execution of the mode register set command, the synchronous semiconductor memory device 9000 may possibly malfunction.

SUMMARY OF THE INVENTION

An object of the present invention is to provide a synchronous semiconductor memory device which is capable of surely resetting the test mode after power on.

Another object of the present invention is to provide a synchronous semiconductor memory device which does not readily allow entrance to the test mode in actual use.

The synchronous semiconductor memory device in accordance with the present invention includes: a plurality of banks each including a memory cell array of a plurality of memory cells arranged in rows and columns, and a plurality of word lines provided corresponding to the rows of the memory cell array; an internal clock generating circuit for outputting an internal clock signal which is synchronized with an external clock signal; a normal mode setting circuit responsive to a mode setting command and an external signal input in synchronization with the internal clock signal, for outputting a normal mode signal indicating designation of a prescribed operation mode; a test mode setting circuit responsive to a mode setting command and a test mode designating signal input in synchronization with the internal clock signal, for detecting designation of a prescribed test mode, and outputting at least one test mode signal as a result of detection; and a reset signal generating circuit responsive to an initialize command for initializing a bank input in synchronization with the clock signal after power on, for outputting a reset signal; and the test mode setting circuit inactivates at least one test mode signal in response to the reset signal.

Therefore, an advantage of the present invention is that the test mode is surely reset in response to the initialize command which is executed after power on.

According to the synchronous semiconductor memory device of the present invention, only the test mode can be reset in response to a reset signal generated when an initialize command is executed. Therefore, even when the test mode is set in actual use, the test mode can immediately and surely be reset. Therefore, malfunction in the actual use can be prevented, while normal operation is ensured.

Preferably, since the reset signal is generated in response to the precharge command, which is one of the initialize commands, it is possible to reset the test mode easily and immediately by utilizing the procedure of initialization.

Preferably, in the synchronous semiconductor memory device, an output operation of a test mode decoder generating the test mode signal can be reset by utilizing the above described reset signal. Therefore, output of the test mode signal can be stopped.

Preferably, in the synchronous semiconductor memory device, content of a latch circuit (register) latching a test mode designating signal can be reset by using the above described reset signal. Therefore, the test mode signal can be inactivated.

Preferably, in the synchronous semiconductor memory device, an output operation of a latch circuit (register) latching and outputting a test mode signal received from the test mode decoder can be reset by utilizing the above described reset signal. Therefore, output of the test mode signal can be stopped.

Preferably, in the synchronous semiconductor memory device, content of a latch circuit (register) latching and outputting a test mode signal received from the test mode decoder can be reset by utilizing the above described reset signal. Therefore, the test mode signal can be inactivated.

Preferably, in the synchronous semiconductor memory device, the test mode signals input to a specific internal circuit can be reset in response to the above described reset signal. Therefore, a test mode which requires much time for recovery can immediately and surely be reset, and therefore the device can be set to the actually usable state immediately.

According to another aspect, the synchronous semiconductor memory device in accordance with the present invention includes: a plurality of banks each including a memory cell array with a plurality of memory cells arranged in rows and columns and a plurality of word lines provided corresponding to the rows of the memory cell array; an internal clock generating circuit for outputting an internal clock signal which is synchronized with an external clock signal; a command detecting circuit responsive to a first command input in synchronization with the internal clock signal for outputting a first command correspondence signal indicating input of the first command; a test mode detecting circuit responsive to a test mode designating signal input in synchronization with the internal clock signal for detecting designation of a test mode; a converting circuit responsive to detection of designation of the test mode by the test mode detecting circuit, for converting the first command correspondence signal to a second command correspondence signal corresponding to a second command different from the first command; and an executing circuit responsive to the second command correspondence signal for executing an operation corresponding to the second command.

Therefore, an advantage of the present invention is that it becomes possible to use the first command as the second command in the test mode, as the first command correspondence signal indicating input of a specific first command is converted to a second command correspondence signal corresponding to a different second command, in the test mode.

Preferably, in the synchronous semiconductor memory device, by decoding combination of external signals and the first command correspondence signal, an internal command can be converted and used as a plurality of second commands.

The synchronous semiconductor memory device includes a circuit for resetting the test mode in response to a second command included in the initialize command, and in the test mode, the first command correspondence signal corresponding to the first command is converted to the second command correspondence signal corresponding to the second command. Therefore in the test mode, it is possible to execute the second command without resetting the test mode, while in the actual use, the test mode can immediately and surely be reset by using the initialize command.

Preferably, in the synchronous semiconductor memory device, address signals may be used to decode an internal command to a plurality of second commands.

Preferably, in the synchronous semiconductor memory device, a burst terminate command inhibiting external output of data read from a bank may be used as the first command.

According to a still further aspect, the synchronous semiconductor memory device includes: an input pad; a plurality of banks each including a memory cell array of a plurality of memory cells arranged in rows and columns, and a plurality of word lines provided corresponding to the rows of the memory cell array; an internal clock generating circuit for outputting an internal clock signal which is synchronized with an external clock signal; a normal mode setting circuit responsive to a mode setting command and an external signal input in synchronization with the internal clock signal for outputting a normal mode signal indicating designation of a prescribed operation mode and a test mode setting circuit responsive to a mode setting command and, a test mode designating signal in synchronization with the internal clock signal, and a voltage at the input pad input, for outputting at least one test mode signal indicating designation of a prescribed test mode. The test mode designating signal includes first and second test mode designating signals. The test mode setting circuit includes: a detecting circuit responsive to the mode setting command for detecting designation of a test mode; a first selecting circuit responsive to detection of the designation of the test mode by the detecting circuit, for selectively activating one of at least one test mode signal corresponding to the second test mode designating signal; and a first control circuit responsive to detection of designation of the test mode by the detecting circuit for enabling operation of the first selecting circuit based on the first test mode designating signal and a signal which is at least twice the external power supply voltage input through the input pad.

Therefore, an advantage of the present invention is that entrance to a specific test mode is allowed based on a high voltage applied to the input pad.

The synchronous semiconductor memory device in accordance with the present invention is allowed to enter the test mode only when a high voltage is applied to an input pad. Therefore, erroneous entrance of a user to the test mode in actual use can be prevented.

Preferably, the synchronous semiconductor memory device includes a special test mode controlled under the super VIH condition, and a test mode controlled by the test mode setting command. Therefore, the special test mode which requires much time for resetting cannot readily be entered. Further, since two different procedure for entering the test mode are provided, the time for testing before delivery can be reduced and efficiency of testing can be improved.

Preferably, in the synchronous semiconductor memory device, entrance to a special test mode is allowed by a combination of high voltages input to input pads. Therefore, possibility of erroneous entrance to the test mode in actual use can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The synchronous semiconductor memory device in accordance with the first embodiment of the present invention generates a reset signal in response to an initialized command and using this signal, the test mode is reset. Accordingly, after power on, the test mode can quickly and surely be reset.

An example of the overall structure of the synchronous semiconductor memory device 1000 in accordance with the first embodiment of the present invention will be described with reference to FIGS. 1 and 2.

Figure 1:
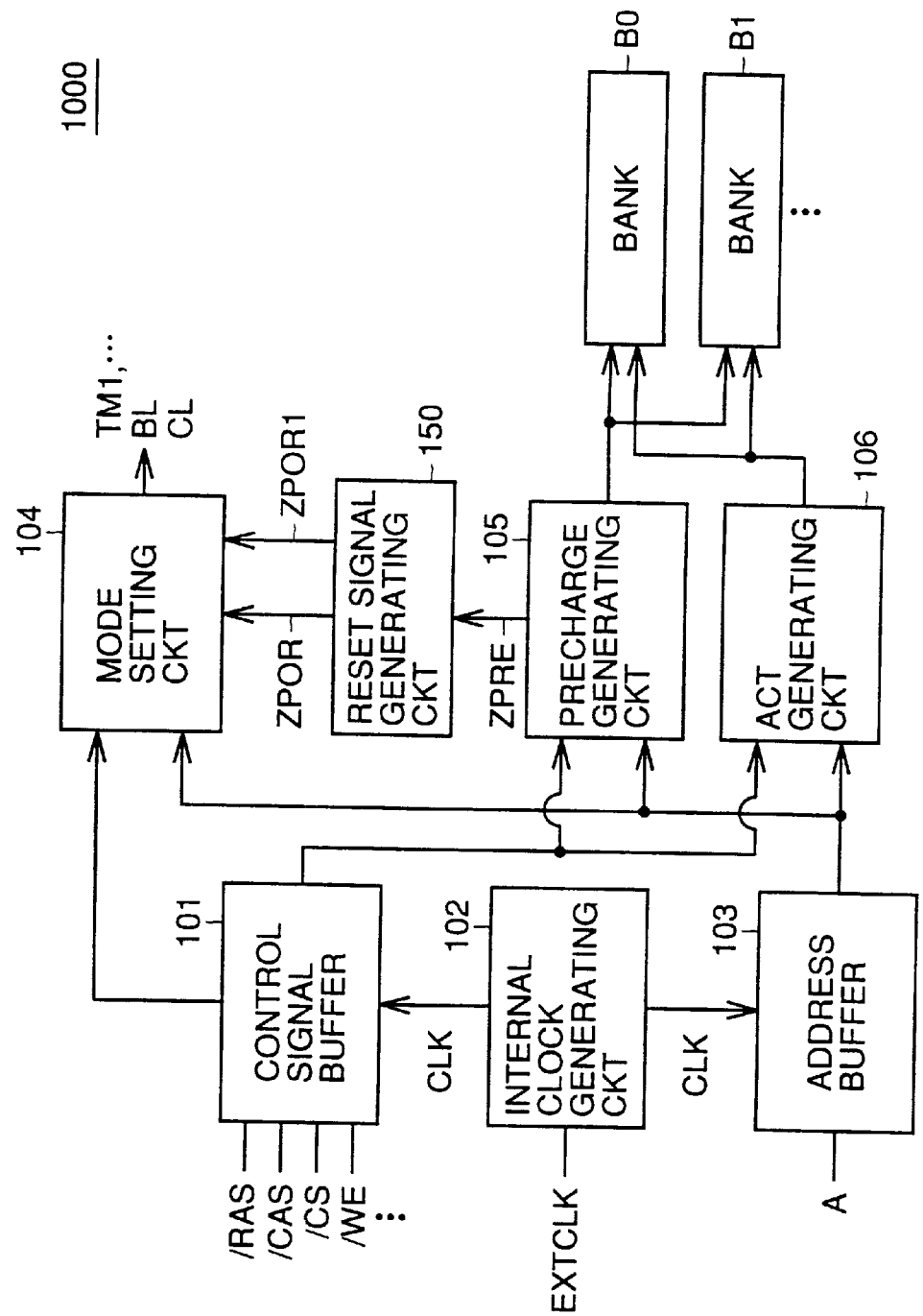
FIG. 1 is a schematic block diagram showing an overall structure of a synchronous semiconductor memory device 1000 in accordance with a first embodiment of the present invention.
Figure 2:
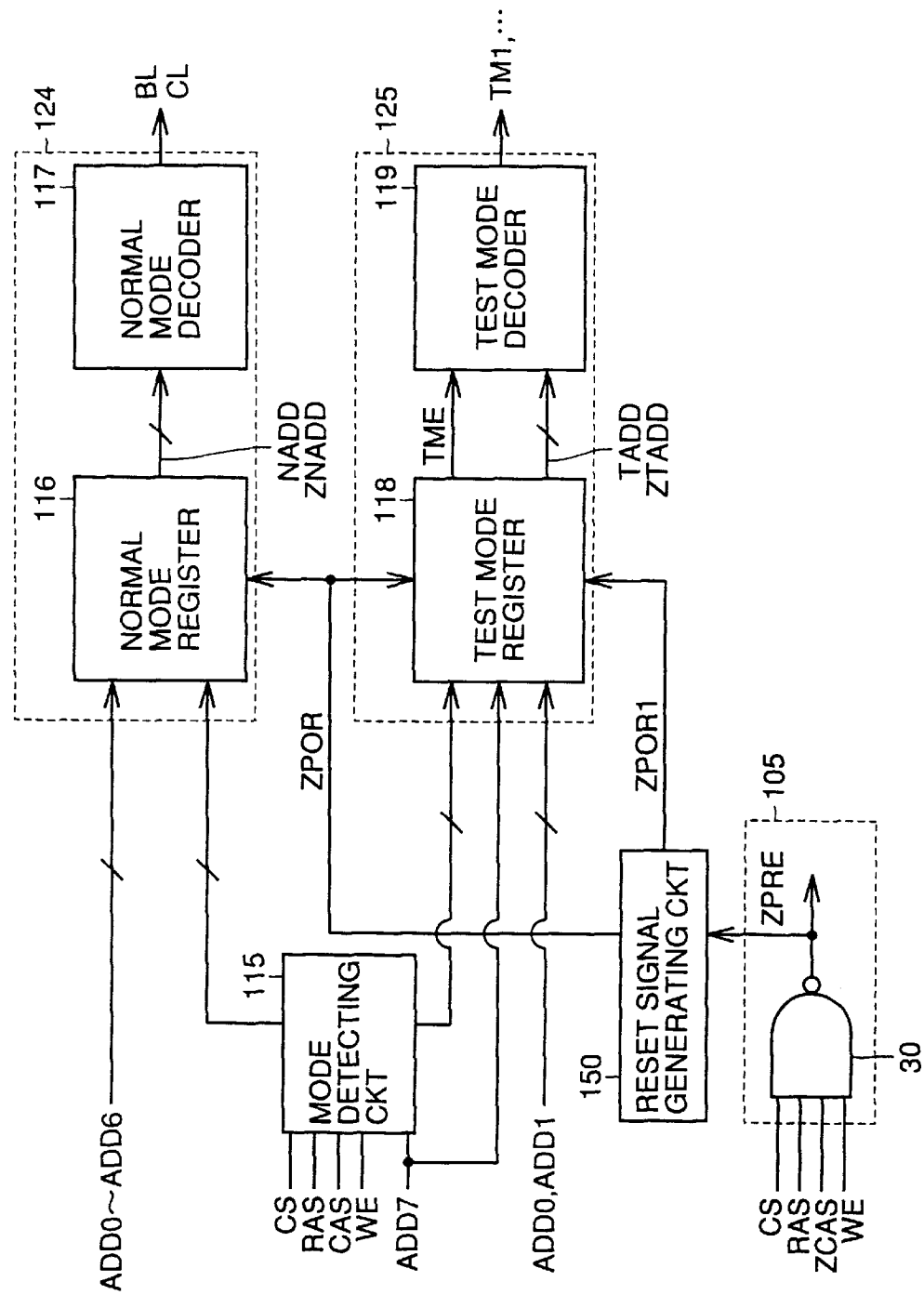
FIG. 2 shows an example of a structure of a main portion of synchronous semiconductor memory device 1000 shown in FIG. 1.

FIG. 1 is a schematic block diagram showing an example of the overall structure of synchronous semiconductor memory device 1000 in accordance with the first embodiment, and FIG. 2 shows a structure of a main portion of the synchronous semiconductor memory device 1000. In the following description, portions corresponding to those of the conventional synchronous semiconductor memory device 9000 will be denoted by the same reference characters and description thereof is not repeated.

The synchronous semiconductor memory device 1000 shown in FIGS. 1 and 2 is different from the conventional synchronous semiconductor memory device 9000 in that a reset signal generating circuit 150 outputting two different reset signals is provided in place of POR generating circuit 100.

As shown in FIG. 2, precharge generating circuit 105 includes an NAND circuit 30 for detecting a precharge command. NAND circuit 30 outputs a precharge signal ZPRE at the L level, when input of the precharge command (internal control signals CS, RAS, ZCAS and WE being at the H level) is detected.

Reset signal generating circuit 150 receives at its input the precharge signal ZPRE output from precharge generating circuit 105, and outputs, in addition to power on reset signal ZPOR, a reset signal ZPOR1.

Normal mode register 116 included in mode setting circuit 104 receives the power on reset signal ZPOR output from reset signal generating circuit 150, similar to the conventional circuit. A test mode register 118 included in mode setting circuit 104 receives, as reset signals, the power on reset signal ZPOR and the reset signal ZPOR1.

Accordingly, it is possible in synchronous semiconductor memory device 1000 to quickly and surely reset the test mode based on the initialize command (for example, the precharge command) executed after power on.

Further, normal mode register 116 is reset by the power on reset signal ZPOR generated immediately after power on as in the prior art. Therefore, the normal mode is never reset by the initialize command.

An example of a specific structure of reset signal generating circuit 150 shown in FIG. 2 will be described with reference to FIG. 3.

Figure 3:
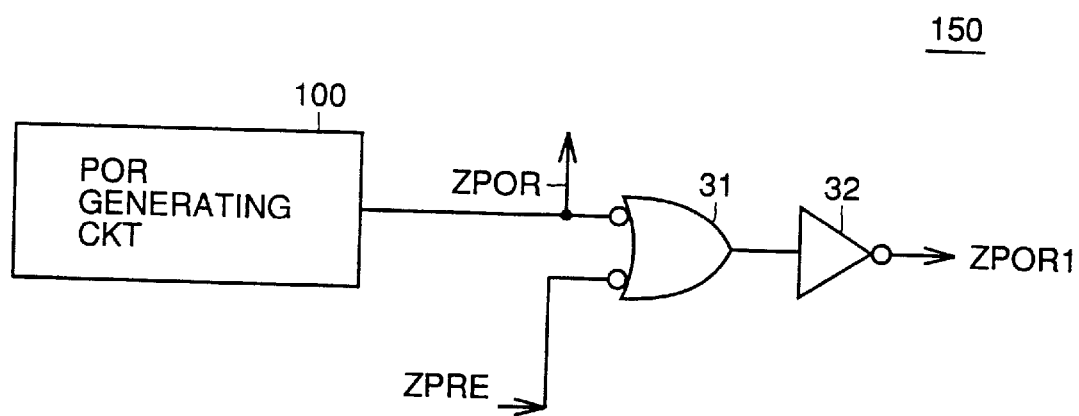
FIG. 3 is a circuit diagram showing an example of a specific structure of a reset signal generating circuit 150 shown in FIG. 2.

Reset signal generating circuit 150 shown in FIG. 3 includes the conventional POR generating circuit 100, an NAND circuit 31 and an inverter circuit 32. As already described, POR generating circuit 100 outputs the power on reset signal ZPOR after power on. NAND circuit 31 receives at its inputs the power on reset signal ZPOR output from POR generating circuit 100 and the precharge signal ZPRE, and outputs a logical sum of these signals. Inverter circuit 32 inverts an output signal from NAND circuit 31 and outputs the reset signal ZPOR1.

Figure 4:
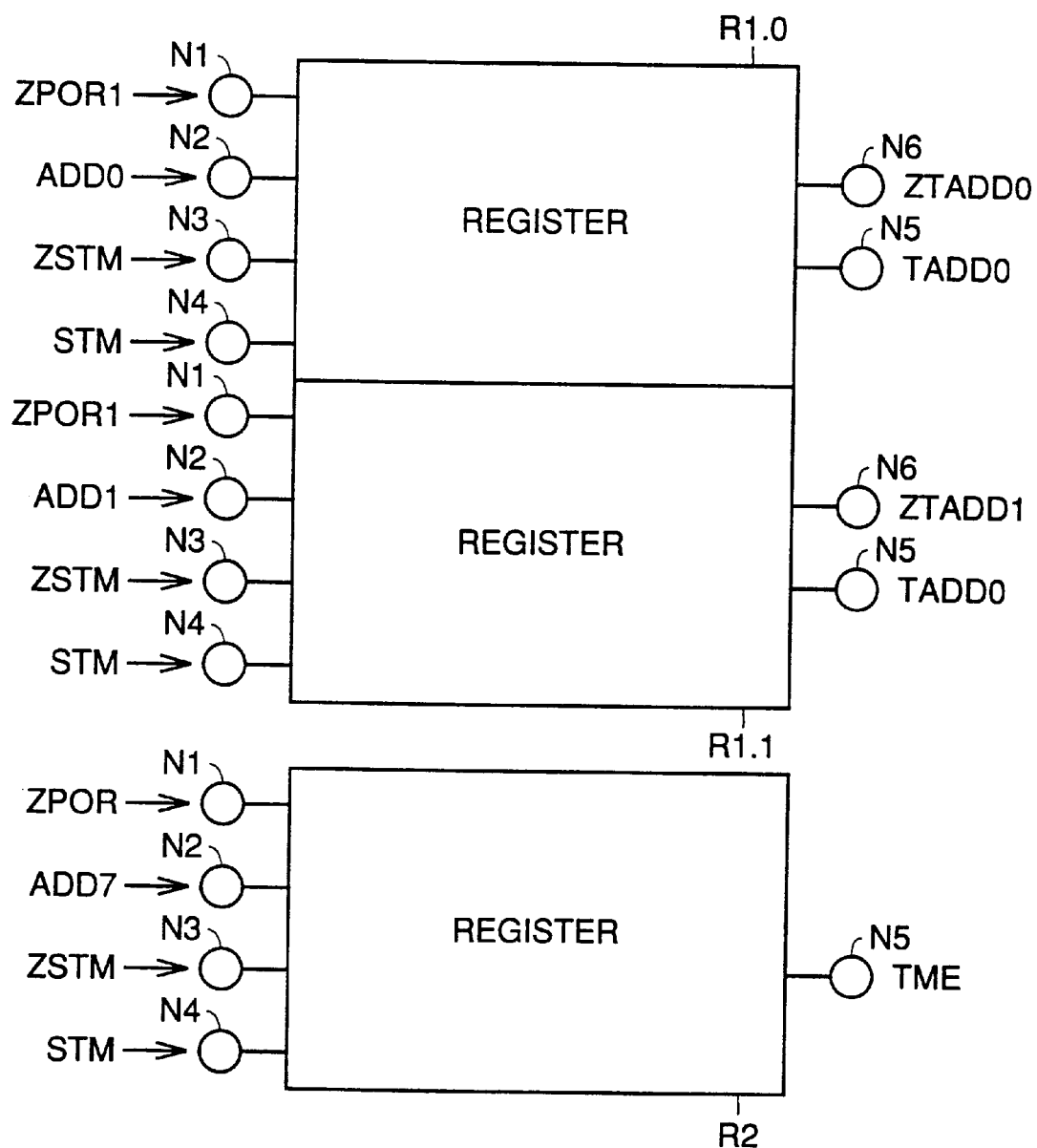
FIG. 4 shows an example of relation between inputs and outputs of a test mode register 118 shown in FIG. 2.

An exemplary relation between test mode register 118 shown in FIG. 2 and the power on reset signal ZPOR and the reset signal ZPOR1 will be described with reference to FIG. 4.

Figure 25:
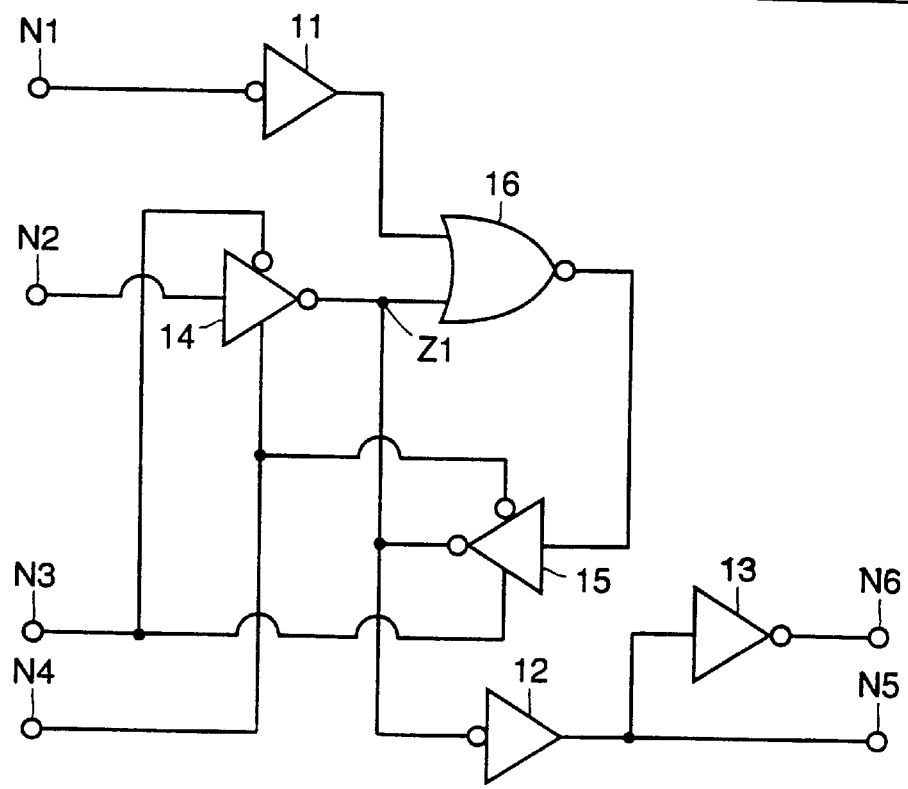
FIG. 25 is a schematic diagram showing a structure of a register R1 included in normal mode register 116 and test mode register 118.

Test mode register 118 shown in FIG. 4 (hereinafter referred to as test mode register 118.1) includes a register R1.0 corresponding to address signal ADD0, a register R1.1 corresponding to address signal ADD1, and a register R2 which is an enabler (corresponding to address signal ADD7). Circuit structure of registers R1.0 and R1.1 as well as R2 is as described with reference to FIG. 25 of the prior art.

The reset signal ZPOR1 is applied to input node N1 of each of registers R1.0 and R1.1 corresponding to address signals ADD0 and ADD1, respectively. The power on reset signal ZPOR is applied to input node N1 of register R2, which is an enabler.

Figure 26:
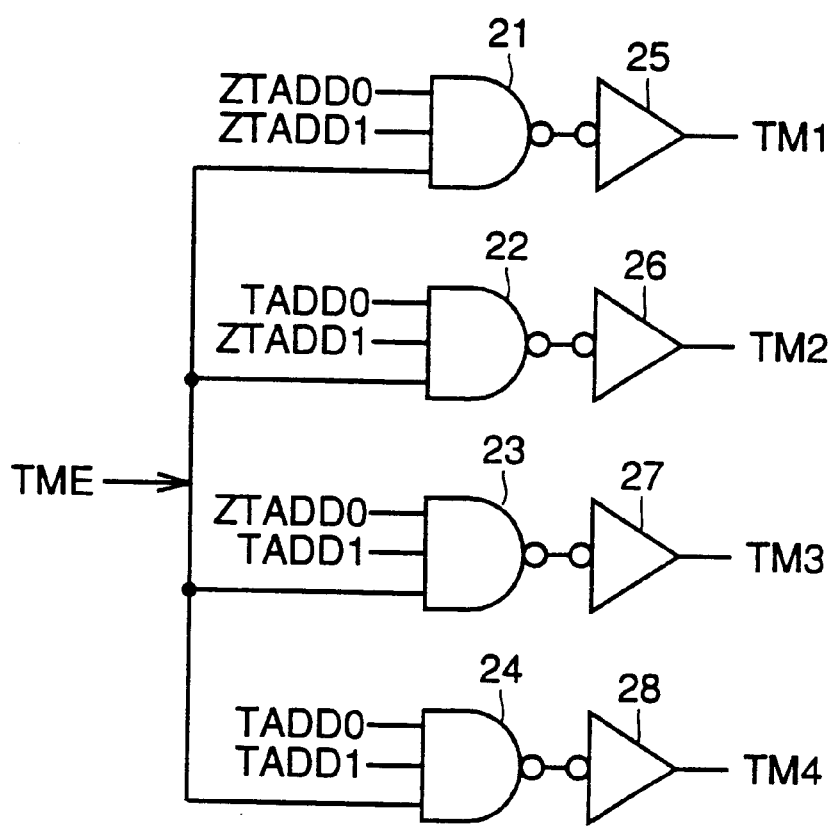
FIG. 26 is a schematic diagram showing a structure of a test mode decoder 119.
Figure 27:
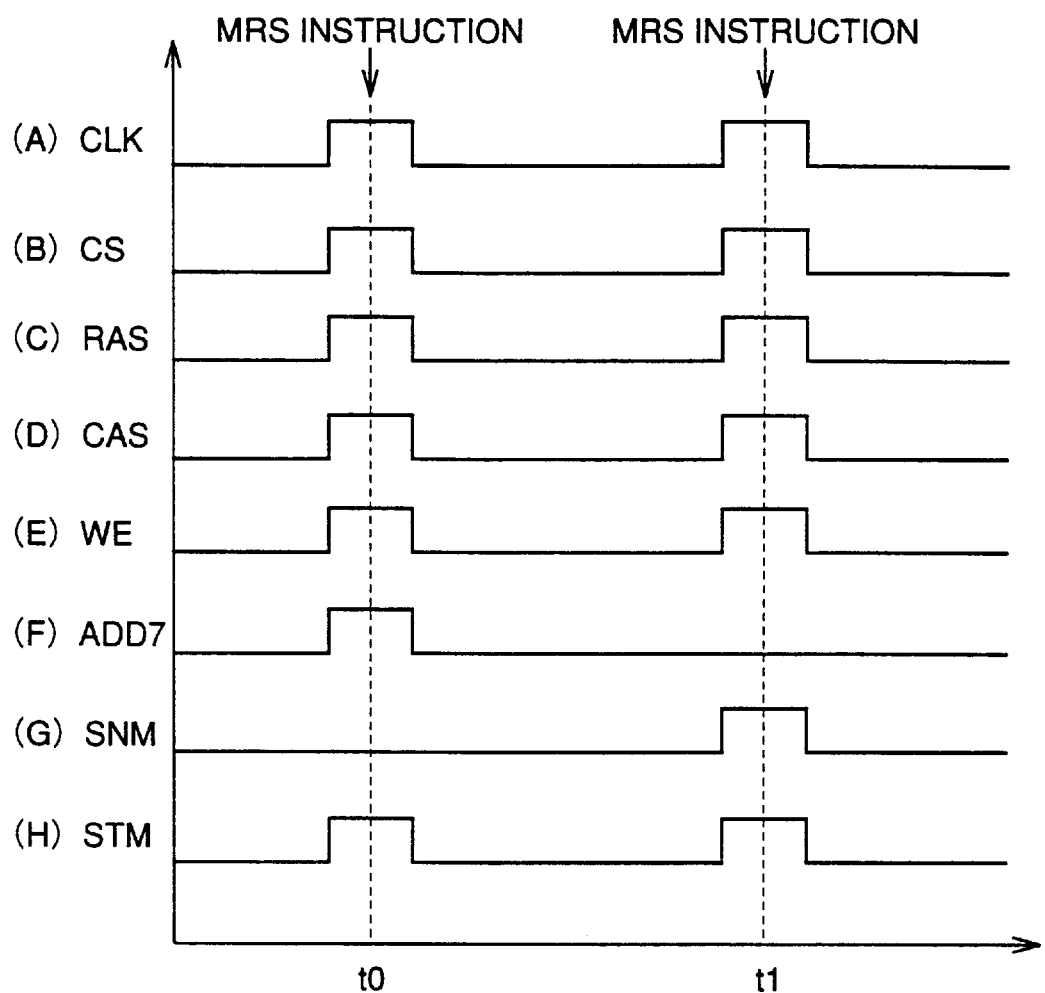
FIG. 27 is a time chart related to the operation of normal mode setting circuit 124 and test mode setting circuit 125.

Accordingly, in the process of executing the initialize command, the signal TADD output from test mode register 118.1 is at the L level and the inverted signal ZTADD is at the H level, and therefore address signals are all reset. As a result, only the test mode signal TM1 among the output signals (test mode signals) of test mode decoder 119 (see FIG. 26) arranged at a succeeding stage attains to the H level, provided that the test mode enable signal TME is at the H level. When the test mode signal TM1 is set as an NOP (No Operation) signal, test mode decoder 119 is set to the NOP state (test mode inactive state), by the reset signal ZPOR1.

Figure 5:
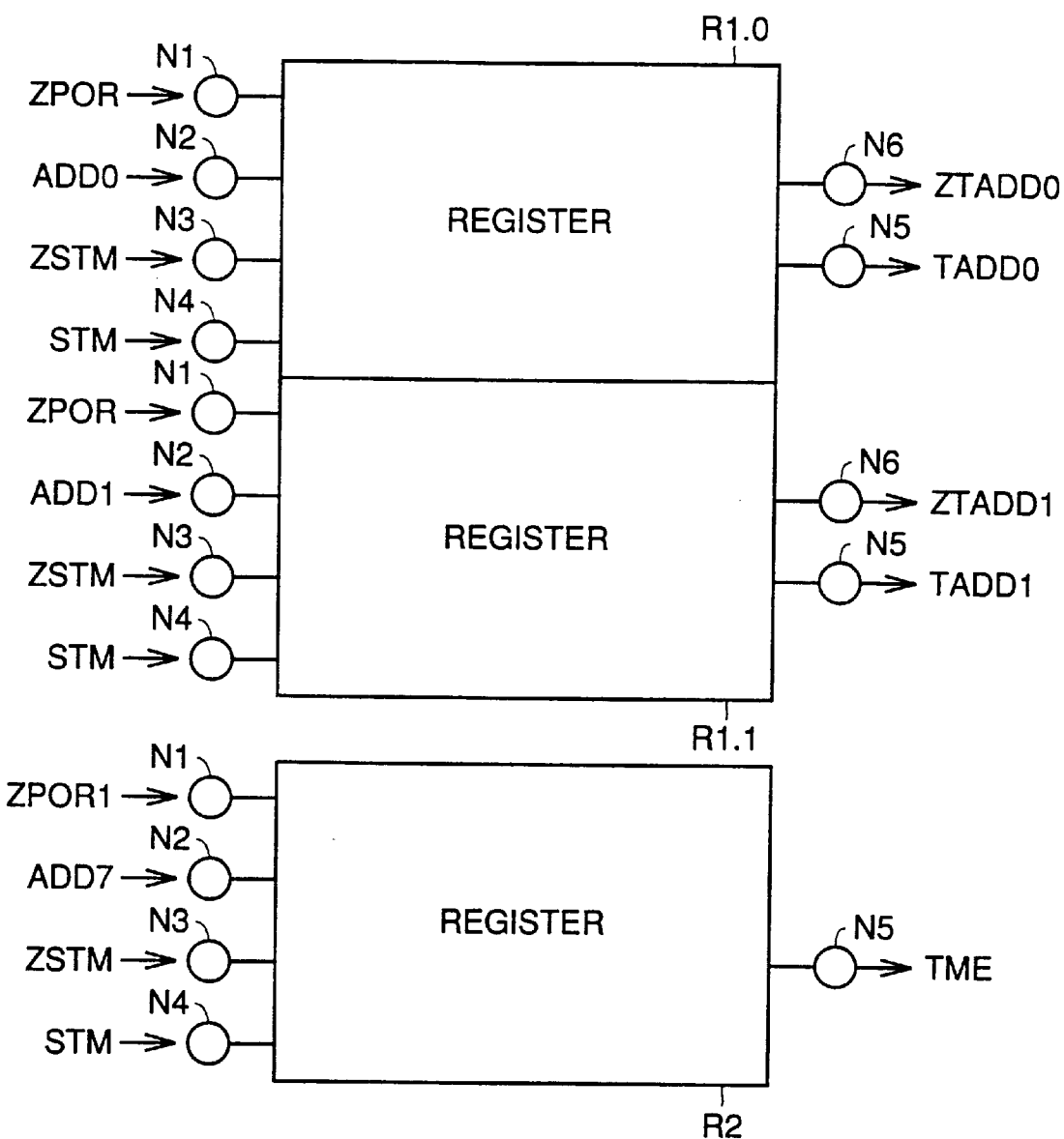
FIG. 5 shows another example of relation between inputs and outputs of test mode register 118 shown in FIG. 2.

Another exemplary relation between test mode register 118 shown in FIG. 2 and the power on reset signal ZPOR and a reset signal ZPOR1 will be described with reference to FIG. 5.

In the test mode register shown in FIG. 5 (hereinafter referred to as test mode register 118.2), the power on reset signal ZPOR is applied to input nodes N1 of registers R1.0 and R1.1. The reset signal ZPOR1 is applied to input node N1 of register R2, which is the enabler.

Accordingly, in the process of executing the initialize command, the test mode enable signal TME output from test mode register 118.2 is set to the reset state (inactive state of L level). As a result, operation of the test mode decoder 119 (see FIG. 26) arranged at a succeeding stage is stopped.

Operation of synchronous semiconductor memory device 1000 in accordance with the first embodiment of the present invention after power on will be described with reference to the time chart of FIG. 6.

Figure 6:
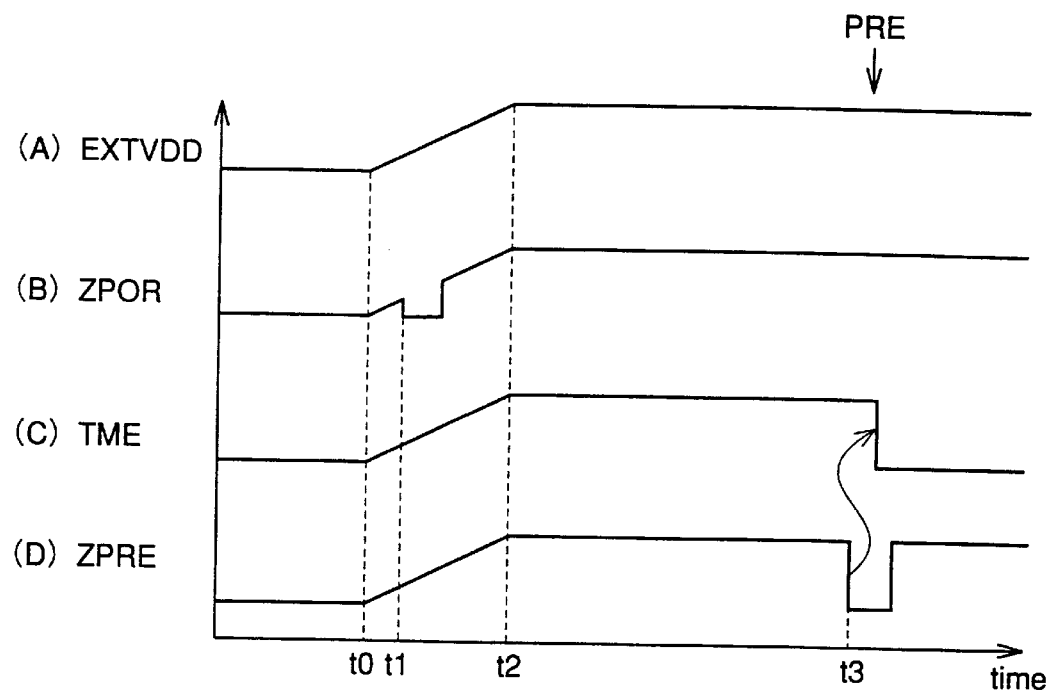
FIG. 6 is a time chart related to an operation of synchronous semiconductor memory device 1000 in accordance with the first embodiment of the present invention.

In FIG. 6, (A) represents the external power supply voltage EXTVDD, (B) represents power on reset signal ZPOR, (C) represents the test mode enable signal TME, and (D) represents the precharge signal ZPRE, respectively.

As shown in FIG. 6, after power on (time t0), the voltage level of external power supply voltage EXTVDD gradually rises to a prescribed level. At time t1, power on reset signal ZPOR is generated. However, when the rise of power supply EXTVDD is moderate, the power on reset signal POR terminates before the external power supply voltage EXTVDD attains to a prescribed level. In that case, the test mode enable signal TME is not reset but maintained at the active state of H level.

After external power supply voltage EXTVDD attains to the prescribed voltage level (time t2), the initialize command is executed. When a precharge command is input (at time t3), the precharge signal ZPRE at the L level (that is, reset signal ZPOR1) is generated. When test mode register 118.2 is used, test mode enable signal TME falls to the L level (when test mode register 118.1 is used, test mode signal TM1 which is set as the NOP signal is set to the H level, and other test mode signals all attain to the L level). As a result, the test mode is reset.

Figure 22:
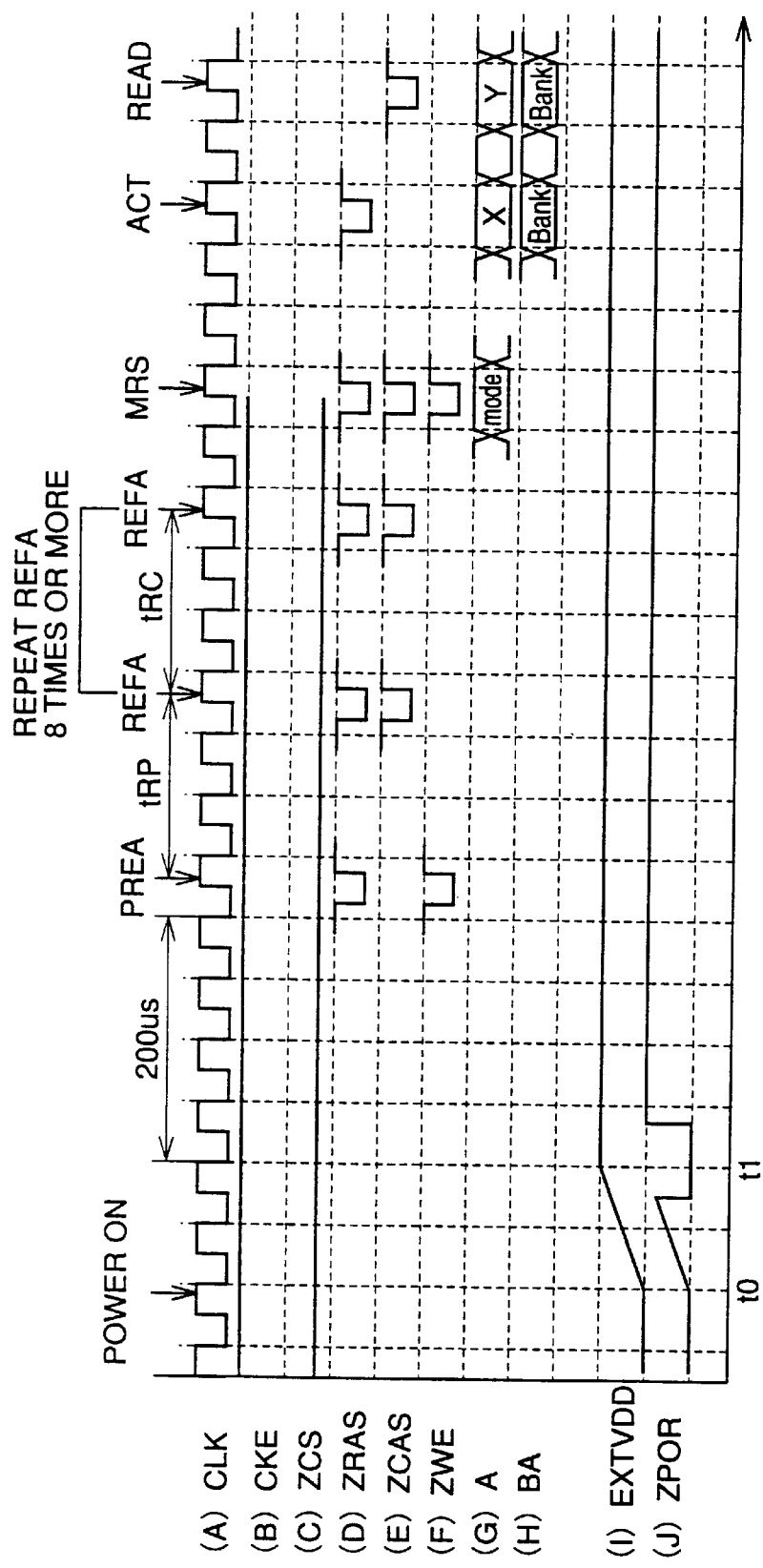
FIG. 22 is a time chart showing a process of normal operation of the conventional synchronous semiconductor memory device 9000 from power on until the device attains to an idle state.
Figure 23:
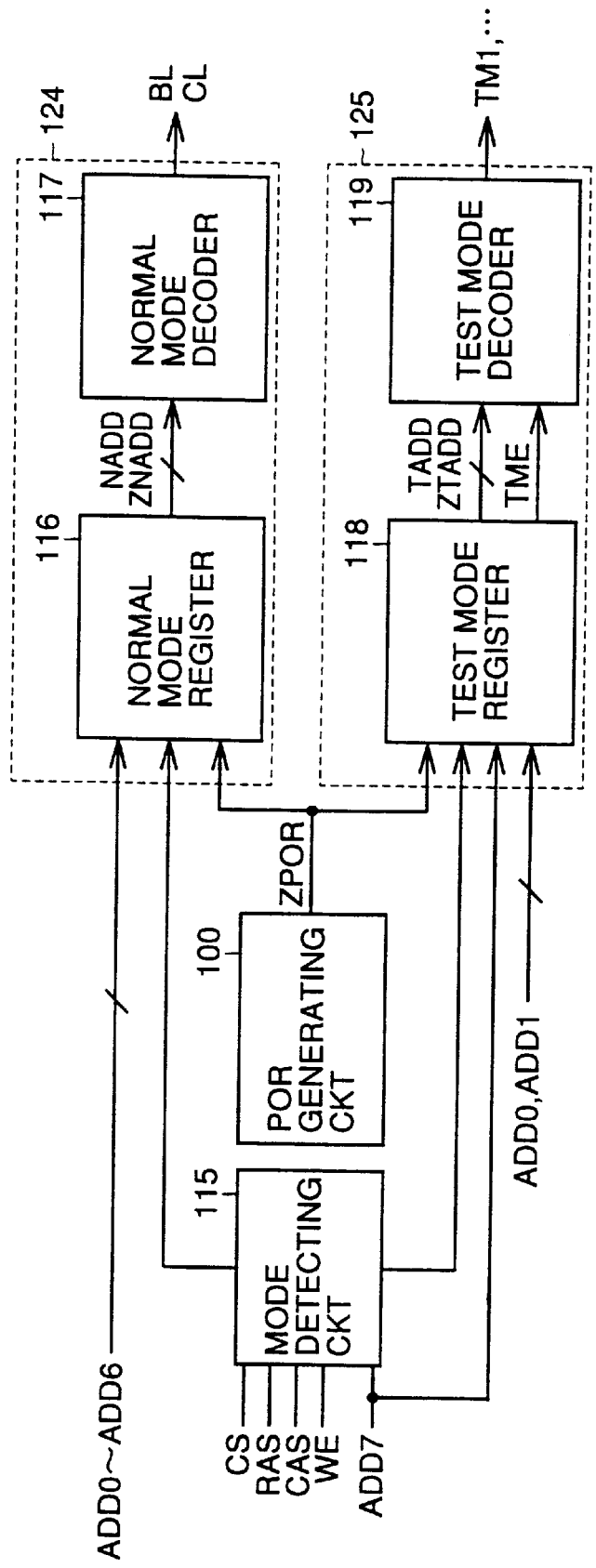
FIG. 23 is a schematic block diagram showing a structure of a conventional mode setting circuit 104.
Figure 24:
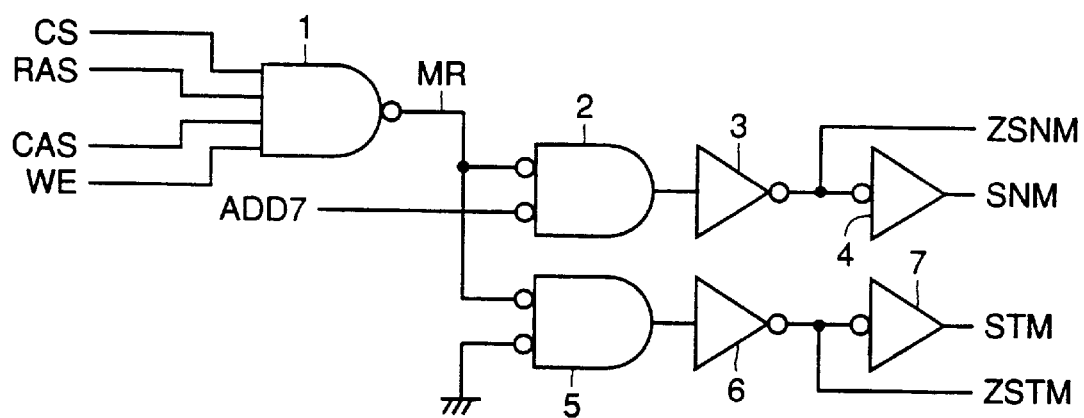
FIG. 24 is a schematic diagram showing a circuit structure of a mode detecting circuit 115.

In accordance with the procedure of executing the initialize command described with reference to the time chart of FIG. 22, after the time period from the input of the precharge command until the end of input of eight auto refresh commands (tRP+tRC×8 =30 ns+80 ns×8=670 ns), the test mode is fully reset.

Therefore, even when a test mode related to the power system which requires much time from resetting until a stable power supply voltage (set value) is recovered is set at the time of power on, the normal set value is surely recovered at the time of actual use.

As to the command for resetting the test mode, it is not limited to the precharge command. Any command may be used provided that it is included in the initialize command (for example, it may be the auto refresh command or the precharge all command).

An example in which the reset signal ZPOR1 is generated by using the auto refresh command will be briefly described with reference to FIG. 7.

Figure 7:
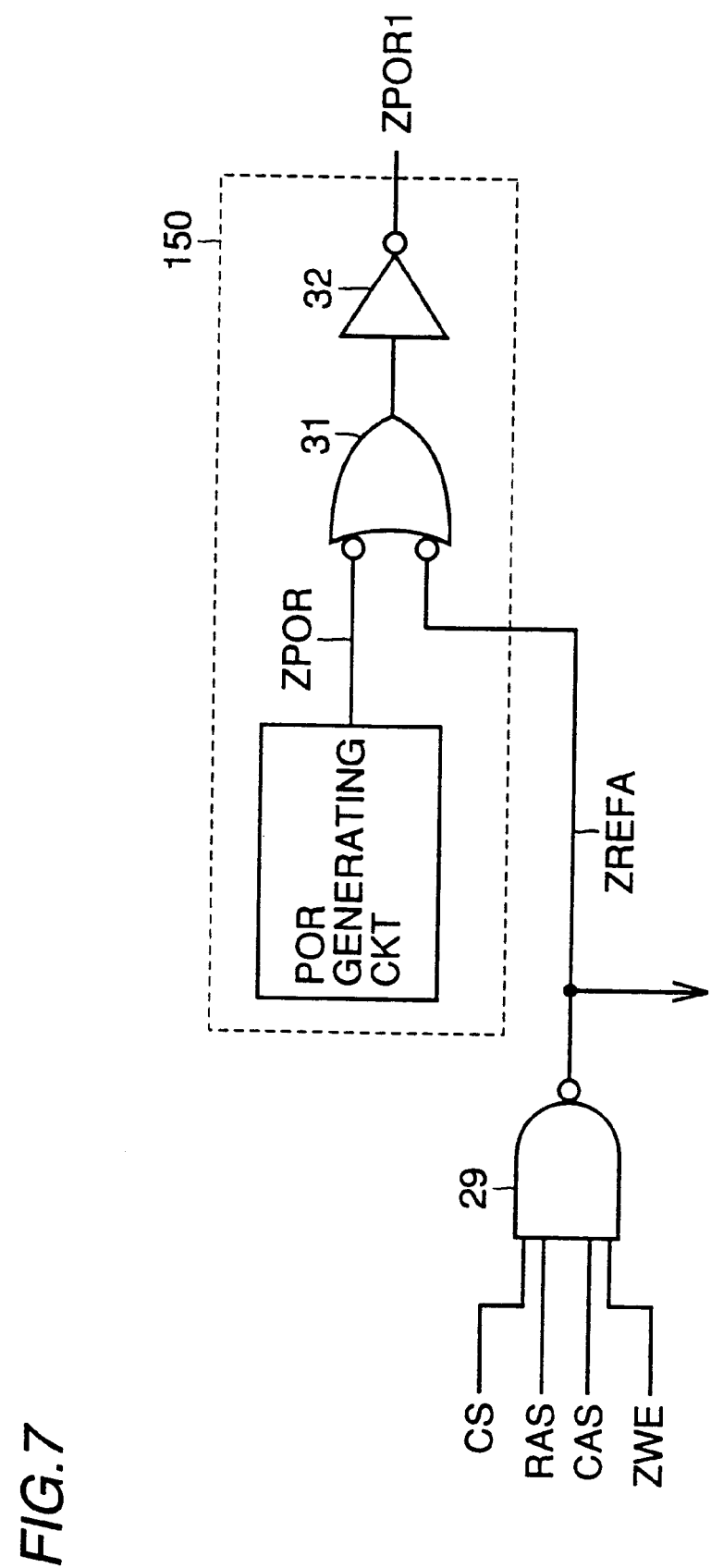
FIG. 7 is a schematic diagram showing a structure for generating a reset signal ZPOR1 using an auto refresh command.

FIG. 7 is a schematic diagram showing an example of a circuit structure for generating the reset signal ZPOR1 by using the auto refresh command. An NAND circuit 29 shown in FIG. 7 outputs an auto refresh signal ZREFA at the L level upon detection of the auto refresh command (internal control signals CS, RAS, CAS and ZWE being at the H level). Reset signal generating circuit 150 receives at its inputs the power on reset signal ZPOR and the auto refresh signal ZREFA, and outputs a logical sum of these signals. Inverter circuit 32 inverts an output signal from NAND circuit 31 and outputs the reset signal ZPOR1.

Consequently, it is possible in synchronous semiconductor memory device 1000 to quickly and surely reset the test mode based on the initialize command (auto refresh command) executed after power on.

In the description above, normal mode decoder 117 is placed in the succeeding stage of normal mode register 116 and test mode decoder 119 is arranged in the succeeding stage of test mode register 118. However, the arrangement is not limited thereto. Normal mode register 116 may be arranged in the succeeding stage of normal mode decoder 117, and test mode register 118 may be arranged in the succeeding stage of test mode decoder 119.

In that case, normal mode register 116 latches mode information (CL, BL and the like) decoded by normal mode decoder 117, and test mode register 118 latches test mode information decoded by test mode decoder 119.

Second Embodiment

The synchronous semiconductor memory device in accordance with the second embodiment of the present invention resets the test mode in response to the initialize command, without using the power on reset signal ZPOR.

An example of a structure of a main portion of synchronous semiconductor memory device 2000 in accordance with the second embodiment will be described with reference to FIG. 8.

In the following description, similar components as those of the conventional synchronous semiconductor memory device 9000 are denoted by the same reference characters and description thereof is not repeated.

The synchronous semiconductor memory device 2000 in accordance with the second embodiment differs from the synchronous semiconductor memory device 1000 in accordance with the first embodiment in that the test mode register 118 is directly reset by the result of detection of an input of the initialize command (for example, the precharge command) without using the power on reset signal ZPOR.

Figure 8:
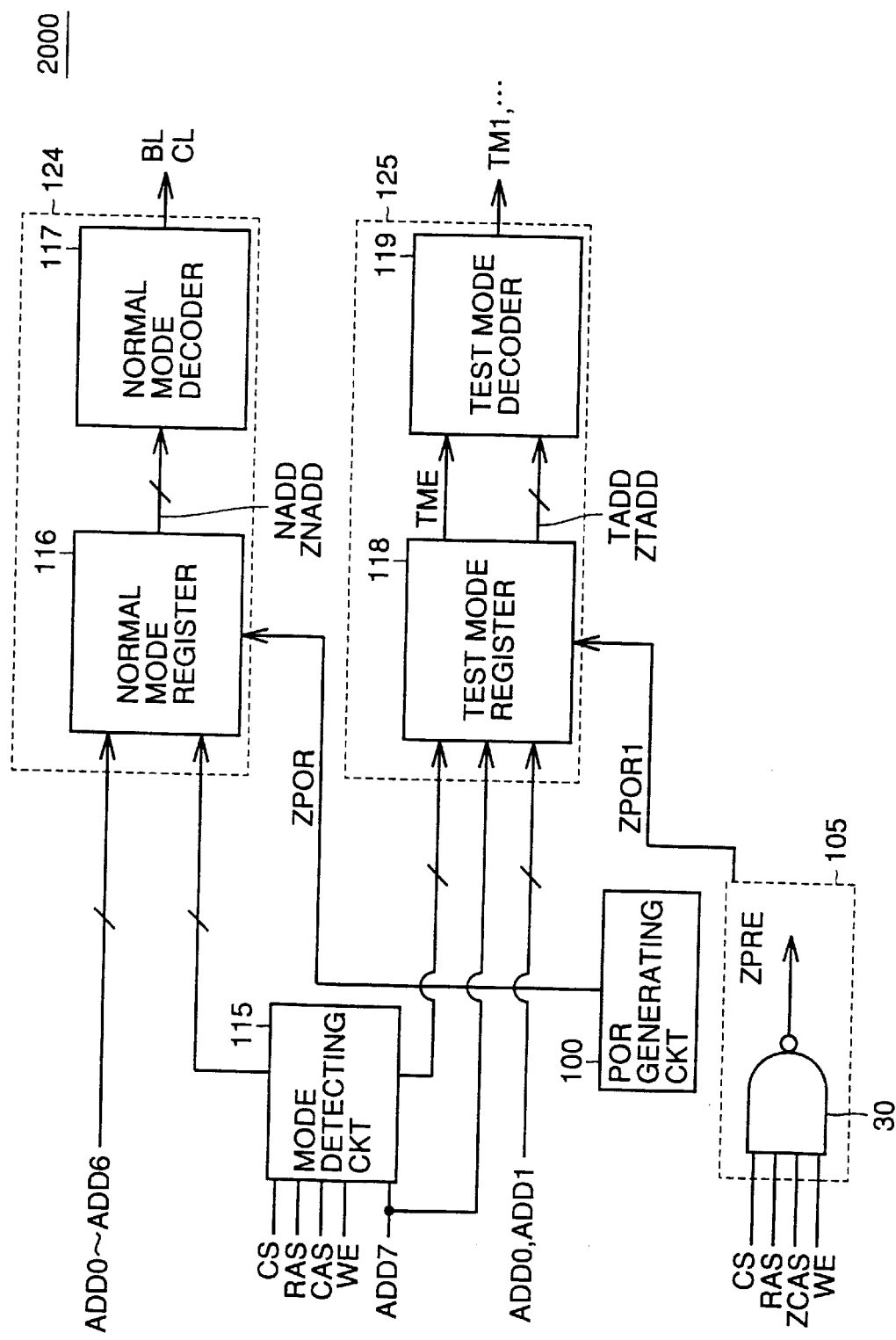
FIG. 8 shows an example of a structure of a main portion of a synchronous semiconductor memory device 2000 in accordance with a second embodiment of the present invention.

As shown in FIG. 8, NAND circuit 30 included in precharge generating circuit 105 outputs the precharge signal ZPRE at the L level upon detection of the precharge command. Test mode register 118 receives the precharge signal ZPRE as the reset signal ZPOR1, and it is reset based on this signal.

As to the method of resetting by the reset signal ZPOR1, a method in which the test mode enable signal TME is set to the inactive state of L level and the method in which address signals ADD0 and ADD1 are reset, are both available as described with reference to the first embodiment above.

Therefore, in accordance with the procedure of executing the initialize command after power on, it is possible to quickly and surely reset the test mode without using the power on reset signal ZPOR in synchronous semiconductor memory device 2000.

The command for resetting the test mode is not limited to the precharge command. Any command included in the initialize command (for example, the auto refresh command, precharge command or the like) may be used.

Third Embodiment

In the synchronous semiconductor memory device in accordance with the third embodiment of the present invention, different from the first and second embodiments, only a specific test mode is reset in response to the initialize command.

The test mode includes test modes related to a circuit system (for example, logic circuit) which does not require much time from resetting of the corresponding test mode until the internal state is recovered, and test modes related to circuit system (for example, power system circuit) which requires much time from the reset of the corresponding test mode until the internal state is recovered.

The logic circuitry operates normally even immediately after the input of the normal operation command after resetting of the corresponding test mode. However, when a test mode related to the power supply circuitry, especially a test mode involving external control of an internal voltage (boosted potential and the like) is erroneously entered, considerable time period is necessary until the voltage level recovers the set value, even when the operation is reset by the conventional mode register set command. As a result, it is possible that an acceptable internal state is not yet recovered at the time of actual use, resulting in malfunction.

Therefore, in the third embodiment of the present invention, such test modes that is related to the circuitry requiring much time from the reset of the corresponding test mode until the recovery of the internal state is reset quickly and surely by using the initialize command.

Figure 9:
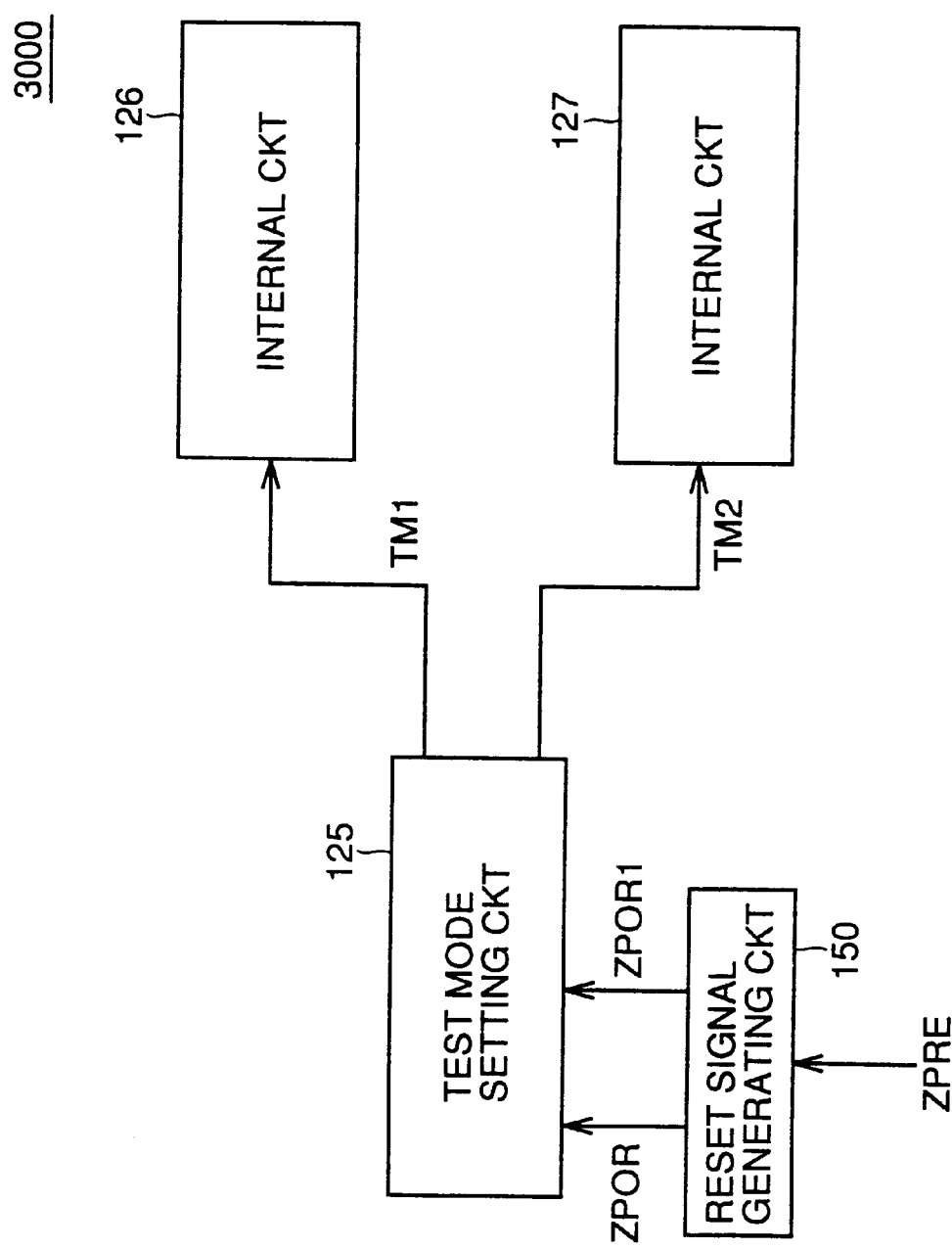
FIG. 9 shows an example of a structure of a main portion of a synchronous semiconductor memory device 3000 in accordance with a third embodiment of the present invention.

An example of a structure of a main portion of the synchronous semiconductor memory device 3000 in accordance with the third embodiment of the present invention will be described with reference to FIG. 9.

In the following description, same portions as those of the conventional synchronous semiconductor memory device 9000 are denoted by the same reference characters and description thereof is not repeated.

Synchronous semiconductor memory device 3000 includes internal circuits 126 and 127. It is assumed that internal circuit 126 is a logic circuit which does not require much time from the reset of the corresponding test mode until recovery of the internal state. Internal circuit 127 is assumed to be the power circuit which requires much time from the reset of the corresponding test mode until recovery of the internal state.

Reset signal generating circuit 150 outputs the reset signal ZPOR1 based on the logical sum of precharge signal ZPRE received from the precharge generating circuit 105 and the conventional power on reset circuit ZPOR.

The reset signal ZPOR1 is used for resetting a test mode TM2 for the internal circuit 127 output from test mode setting circuit 125. The power on reset signal ZPOR is used for resetting the test mode TM1 for internal circuit 126 output from test mode setting circuit 125.

As an example, two registers outputting the test mode enable signal TME are provided. The power on reset signal ZPOR is applied to one of the registers. The decoder portion outputting the test mode TM1 is adapted to be reset by the test enable signal output from this register.

The reset signal ZPOR1 is applied to the other one of the registers. The decoder portion outputting test mode signal TM2 is adapted to be reset by the test enable signal output from the register.

As a result, even when the power on reset signal ZPOR is terminated immediately after power on and the test mode is erroneously set, the test mode signal TM2 for the internal circuitry 127 is surely reset in the process of executing the initialize command. The test mode signal TM1 for internal circuit 126 is reset by the power on reset signal ZPOR or by the mode register set command.

Internal circuit 127 includes not only the circuit related to the power supply but also a logic circuit which requires much time from the resetting of the corresponding test mode to the recovery of the internal state. For example, when a word line is activated in the test mode, a time period of 20 ns to 30 ns is normally required until the activated word line is inactivated. Therefore, there is a possibility of malfunction when an act command is executed within 20 ns after the input of the mode register set command. Therefore, such a test mode is also reset by the reset signal ZPOR1 based on the precharge command. As a result, synchronous semiconductor memory device 3000 is immediately set to an actually usable state after completion of the mode register set command.

The command for resetting a test mode is not limited to the precharge command. Any command may be used provided that it is included in the initialize command (for example, the auto refresh command or the precharge all command).

Fourth Embodiment

An example of a structure of a main portion of synchronous semiconductor memory device 4000 in accordance with the fourth embodiment of the present invention will be described with reference to FIG. 10.

In the following description, similar components as those of the conventional synchronous semiconductor memory device 9000 will be denoted by the same reference characters and description thereof is not repeated.

In the first to third embodiments, test mode setting circuit 125 is reset in response to the power on reset signal ZPOR or the initialize command. In synchronous semiconductor memory device 4000 in accordance with the fourth embodiment of the present invention, a test mode signal is reset and applied in response to the initialize command only to a specific internal circuit (in FIG. 10, internal circuit 129).

Figure 10:
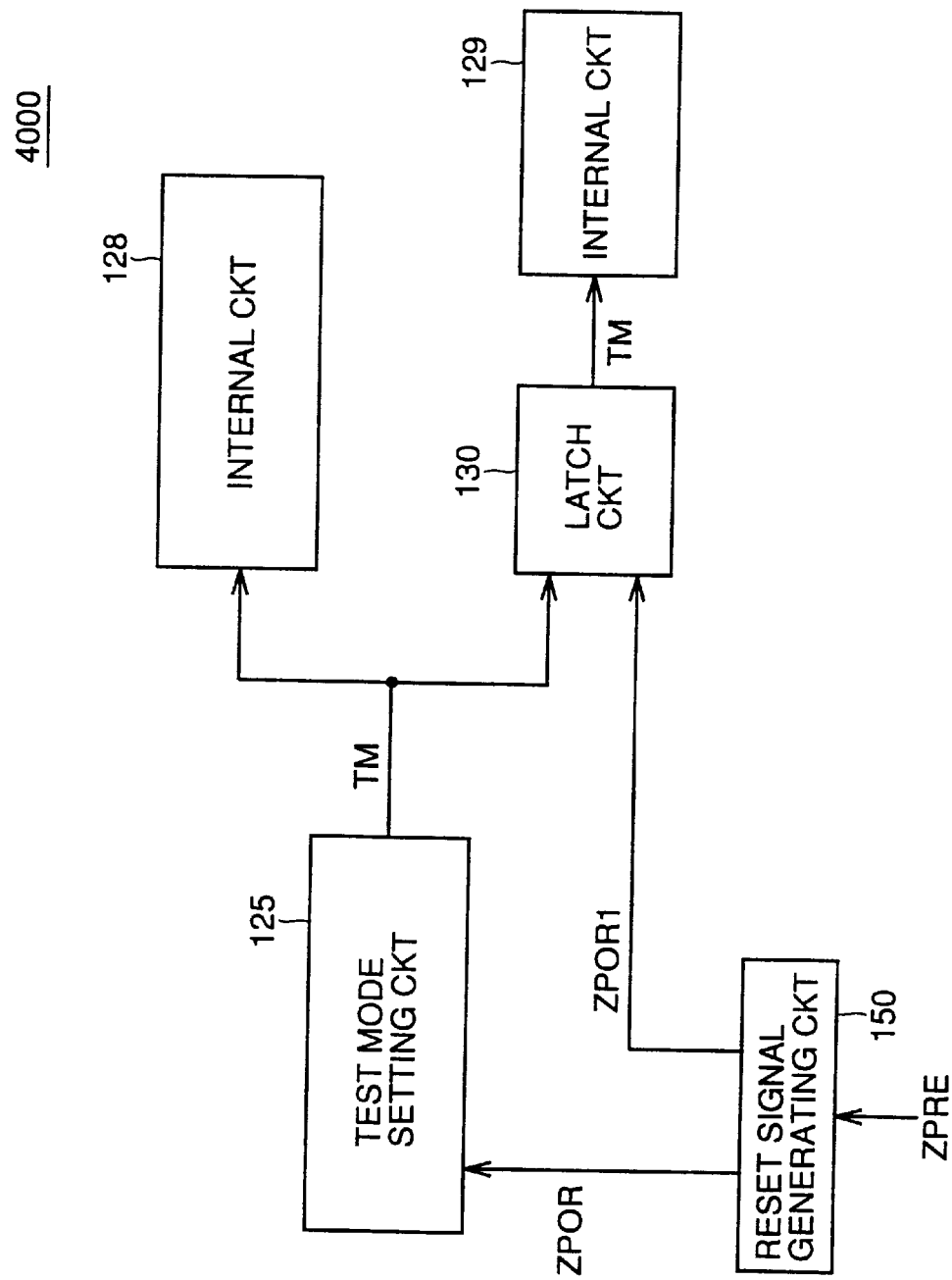
FIG. 10 shows an example of a structure of a main potion of a synchronous semiconductor memory device 4000 in accordance with a fourth embodiment of the present invention.

Synchronous semiconductor memory device 4000 shown in FIG. 10 includes test mode setting circuit 125, reset signal generating circuit 150, internal circuits 128 and 129, and a latch circuit 130.

Reset signal generating circuit 150 outputs the power on reset signal ZPOR and the reset signal ZPOR1. As already described, reset signal generating circuit 150 generates the reset signal ZPOR1 based on the logical sum of the power on reset signal ZPOR and a signal corresponding to the initialize command (for example, the precharge signal ZPRE shown in FIG. 10).

Test mode setting circuit 125 is reset by the power on reset signal ZPOR. Latch circuit 130 receives, latches and outputs test mode signal TM from test mode setting circuit 125. When the reset signal ZPOR1 from reset signal generating circuit 150 is received, latch circuit 130 resets (inactivates) the test mode signal TM and outputs the reset signal.

Internal circuit 129 receives test mode signal TM through latch circuit 130. Internal circuit 128 receives test mode signal TM directly from test mode setting circuit 125.

A specific example of internal circuit 128 includes a logic circuit which does not require much time from resetting of the test mode until recovery of the internal state. A specific example of internal circuit 129 includes a logic circuit or a circuit related to power supply which requires much time from resetting of the test mode until recovery of the internal state.

By such a structure, even when resetting by the power on reset signal ZPOR after power on is insufficient and the test mode is erroneously set, internal circuit 129 surely exits from the test mode in the process of executing the initialize command (in the figure, precharge signal ZPRE).

The test mode signal TM input to internal circuit 128 is reset without fail by the power on reset signal ZPOR or the mode register set command.

Therefore, synchronous semiconductor memory device 4000 is immediately set to the actually usable state after completion of the mode register set command.

The command for resetting the test mode is not limited to the precharge command. Any command may be used provided that it is included in the initialize command (for example, the auto refresh command or the precharge all command).

Fifth Embodiment

In the synchronous semiconductor memory devices 1000, . . . , 4000 in accordance with the first to fourth embodiments, examples of circuits in which the test mode is reset by using a precharge command (as an example) included in the initialize command have been described. However, these structures suffer from the problem that the precharge command cannot be executed in the test mode (since when executed, the device exits from the test mode).

Accordingly, in the synchronous semiconductor memory device of the fifth embodiment, it is made possible to convert a specific command to a command (for example, a precharge command) for generating a reset signal, in the test mode. As a result, it becomes possible to reset the test mode by the initialize command and to execute the initialize command represented by the precharge command even in the test mode.

A structure of a main portion of synchronous semiconductor memory device 5000 in accordance with the fifth embodiment of the present invention will be described with reference to FIG. 11.

Synchronous semiconductor memory device 5000 in accordance with the fifth embodiment of the present invention includes a command decoder 50. Command decoder 50 includes NAND circuits 36, 37, 38, 39 and 40, NOR circuits 41, 42 and 43, inverter circuits 44, 45, 46 and 47, an AND circuit 48 and an NOR circuit 49.

Figure 11:
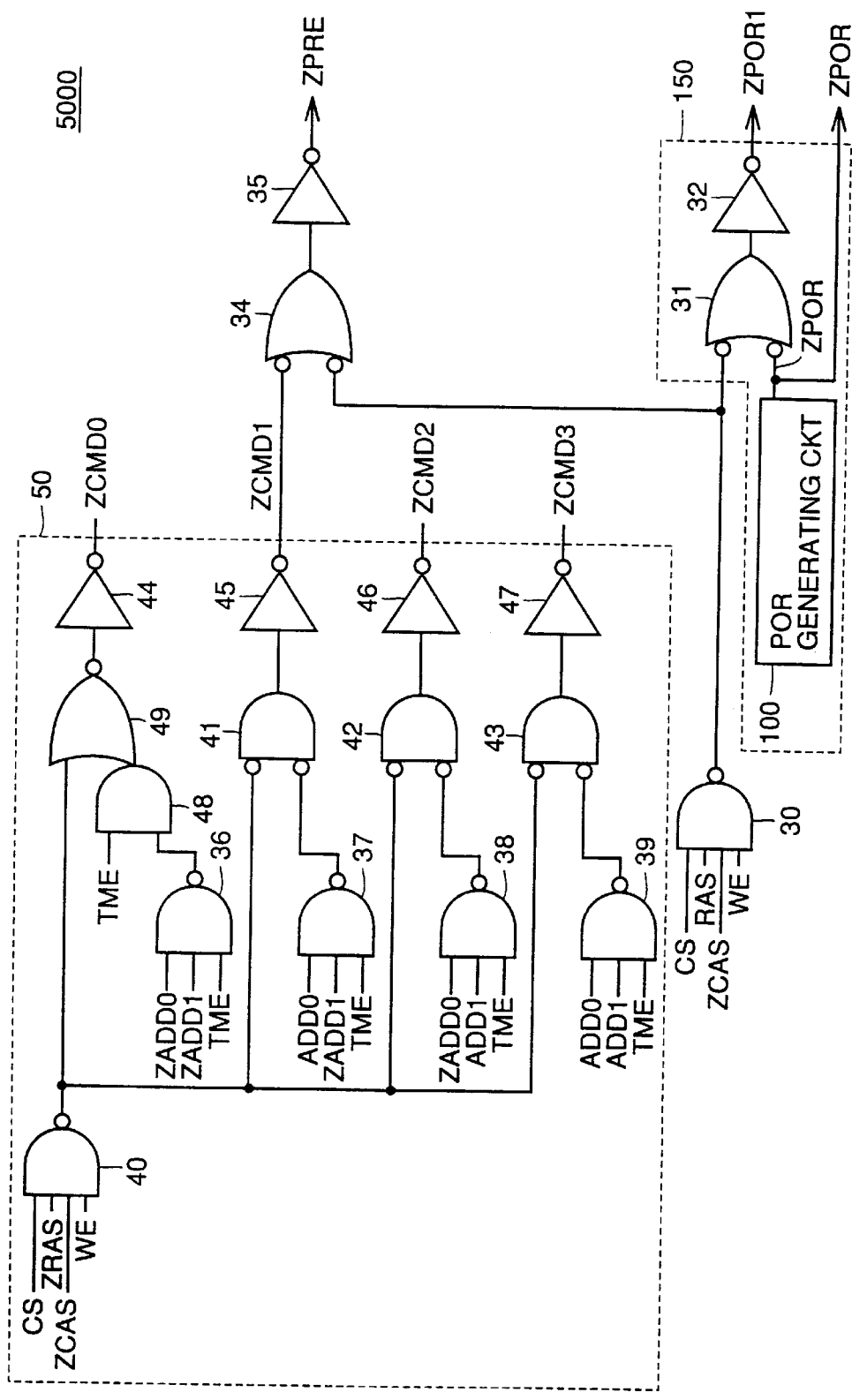
FIG. 11 shows an example of a structure of a main potion of a synchronous semiconductor memory device 5000 in accordance with a fifth embodiment of the present invention.

Referring to FIG. 11, inverted address signal ZADD0 corresponds to and has an opposite phase to address signal ADD0. Inverted address signal ZADD1 corresponds to and has opposite phase to address signal ADD1.

When a burst terminate command (internal control signals CS, ZRAS, ZCAS and WE all being at the H level) is detected, NAND circuit 40 outputs a signal at the L level.

NAND circuits 36, 37, 38 and 39 receive, at respective third input node, the test mode enable signal TME from a test mode register, not shown. As already described, the test mode enable signal TME is at the inactive state of L level in the normal mode (other than the test mode) and is at the active state of H level in the test mode.

NAND circuit 36 receives at a first input node, inverted address signal ZADD0 and at a second input node, inverted address signal ZADD1. NAND circuit 37 receives at a first input node address signal ADD0 and, and at a second input node, inverted address signal ZADD1. NAND circuit 38 receives at a first input node, inverted address signal ZADD0, and at a second input node, address signal ADD1. NAND circuit 39 receives at a first input node, address signal ADD0 and, at a second input node, address signal ADD1.

NOR circuits 41, 42 and 43 receive, at respective first input node, an output signal from NAND circuit 40. NOR circuit 41 receives at a second input node, an output signal from NAND circuit 37. NOR circuit 42 receives at a second input node, an output signal from NAND circuit 38. NOR circuit 43 receives, at a second input node, an output signal from NAND circuit 39.

Inverter circuit 45 inverts an output signal from NOR circuit 41 and outputs a command signal ZCMD1. Inverter circuit 46 inverts an output signal from NOR circuit 42 and outputs a command signal ZCMD2. Inverter circuit 47 inverts an output signal from NOR circuit 43 and outputs a command signal ZCMD3.

AND circuit 48 receives at a first input node, the test mode enable signal TME and at a second input node, an output signal from NAND circuit 36. NOR circuit 49 receives at a first input node, an output signal from NAND circuit 40 and at a second input node, an output signal from AND circuit 48. Inverter circuit 44 inverts an output signal from NOR circuit 49 and outputs a command signal ZCMD0.

Synchronous semiconductor memory device 5000 further includes an NAND circuit 34 and an inverter circuit 35. NAND circuit 34 receives at a first input node, the command signal ZCMD1 output from command decoder 50. NAND circuit 34 receives at a second input node, an output signal from NAND circuit 30 detecting the precharge command. The output signal from NAND circuit 30 is further input to the reset signal generating circuit 150. Inverter circuit 35 inverts an output signal from NAND circuit 34 and outputs the resulting signal as the precharge signal ZPRE. A bank, not shown, is precharged in response to the precharge signal ZPRE output from inverter circuit 35.

Operation of synchronous semiconductor memory device 5000 shown in FIG. 11 will be briefly described.

In the test mode, command decoder 50 is capable of decoding the burst terminate command to any of command signals ZCMD0, . . . , ZCMD3, in accordance with the combination of address signals ADD0 and ADD1.

When the command signal ZCMD1 at the L level is generated, it is designated internally that a precharge command is input. By generation of the command signal ZCMD0 at the L level, it is internally designated that the burst terminate command is input.

For example, when the burst terminate command is input while address signals ADD0 and ADD1 are both at the L level in the test mode, then the command signal ZCMD0 at the L level is output from command decoder 50.

When the burst terminate command is input while address signal ADD0 is at the H level and address signal ADD1 is at the L level, the command signal ZCMD1 at the L level is output. In this case, the precharge signal ZPRE at the L level is output from inverter 35. Since the output signal from NAND circuit 30 is at the H level, the reset signal responsive to the precharge command is not output. Therefore, only the precharge command is executed and the test mode is not reset.

In the normal mode, when the burst terminate command is received, command decoder 50 outputs command signal ZCMD0 at the L level.

As a result, execution of the precharge command in the test mode is ensured and, in the normal mode, the test mode is quickly and surely reset in response to the initialize command.

Though the burst terminate command is converted (reset) in accordance with the combination of address signals in the foregoing description, the address signals are not limited to ADD0 and ADD1.

Further, external control signal DQM or CKE may be used to realize the combination. Further, command is not limited to the burst terminate command. For example, an instruction may be decoded in the similar manner utilizing a self refresh entry command. Further, an instruction may be decoded differently in accordance with the combination of address signals or a combination of external control signal DQM and the like, utilizing the act command.

Further, it is not necessary to decode using two or more signals. For example, it is possible to regard the burst terminate command directly as the precharge command in the test mode.

Sixth Embodiment

In the above described synchronous semiconductor memory devices 1000, . . . , 5000 in accordance with the first to fifth embodiments, the normal mode or the test mode is set in accordance with the combination of the mode register set command and address signals.

By contrast, in the synchronous semiconductor memory device in accordance with the sixth embodiment of the present invention, a special test mode enters only under a high voltage condition (super VIH condition) which is never used in the normal operation. This almost eliminates possibility of a user erroneously entering a special test mode (especially test requiring much time for resetting).

A time period of several hundreds microseconds is necessary to change the voltage from the normal VIH level to the super VIH level and to return the voltage level from the super VIH to the normal VIH level. Therefore, when the super VIH condition is imposed for the entrance of every special test mode, test before delivery requires too long a time period.

For this reason, taking efficiency of testing into consideration, in the sixth embodiment of the present invention, a test mode which can readily be reset by the mode register set command is set by the mode register set command and address signal ADD7, while a special test mode (for example, test of a circuit related to the power supply system) requiring much time for resetting is adapted to be set when the super VIH condition is satisfied. Therefore, it is not possible to readily enter the special test mode which requires much time for resetting, in actual use. Further, necessary time for testing before delivery can be reduced.

An example of a structure of a main portion of synchronous semiconductor memory device 6000 in accordance with the sixth embodiment will be described with reference to FIG. 12.

In the following description, similar components as those of the conventional synchronous semiconductor memory device 9000 are denoted by the same reference characters and description thereof is not repeated.

Figure 12:
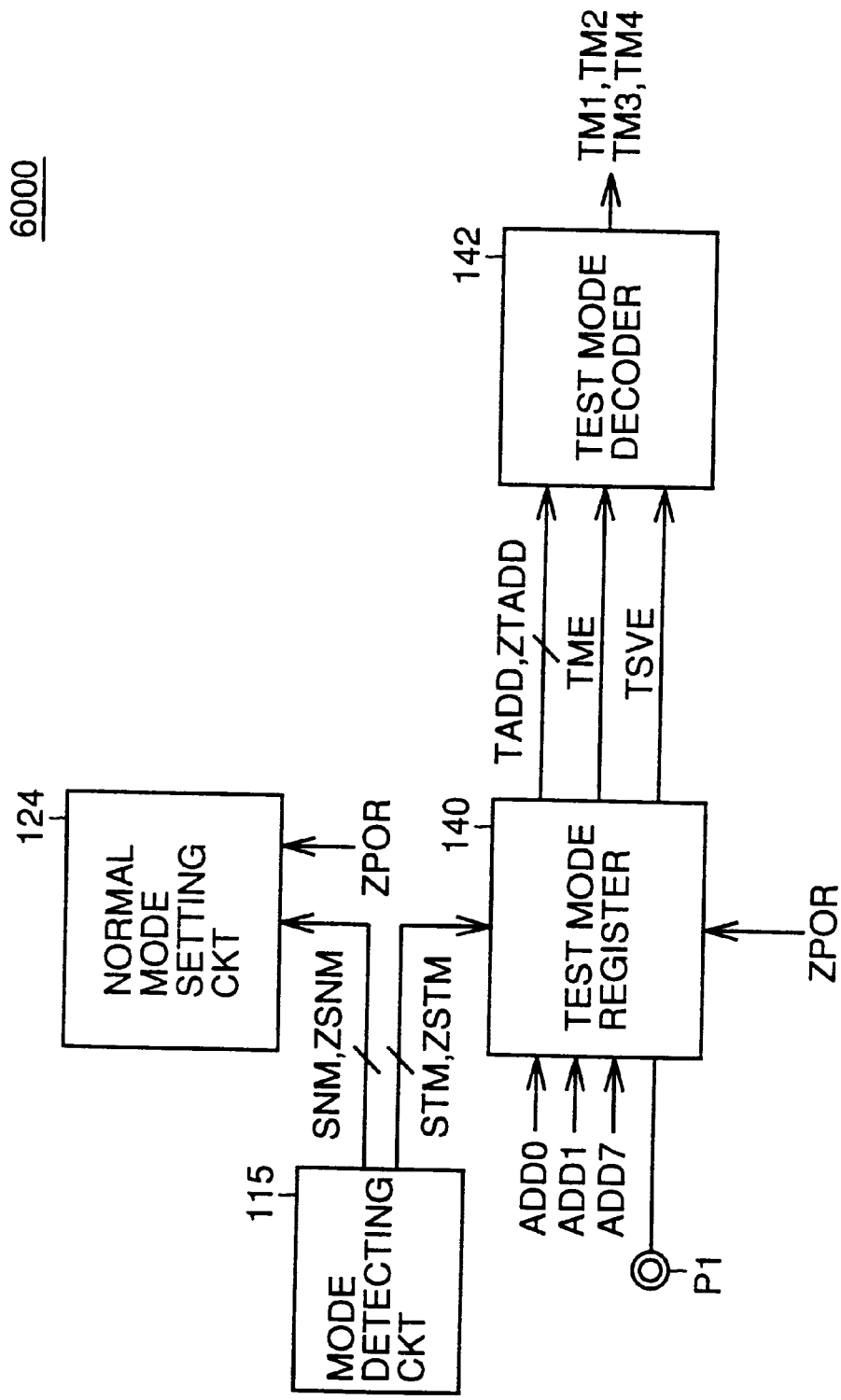
FIG. 12 shows an example of a structure of a main potion of a synchronous semiconductor memory device 6000 in accordance with a sixth embodiment of the present invention.

Referring to FIG. 12, synchronous semiconductor memory device 6000 includes a test mode register 140 and test mode decoder 142. Test mode register 140 receives address signals ADD0, ADD1 and ADD7, test mode set signal STM and the inverted signal ZSTM. Test mode register 140 is connected to input pad P1. Test mode register 140 outputs signals TADD, ZTADD, test mode enable signal TME and a special test mode enable signal TSVE.

Test mode decoder 142 is set to the enabled state by the test mode enable signal TME or the special test mode enable signal TSVE, and outputs test mode signals TM1, TM2, . . . in response to the signal TADD and its inverted signal ZTADD output from test mode register 140.

The structure of test mode register 140 shown in FIG. 12 and an example of the relation between inputs and outputs of the register will be described with reference to FIG. 13.

Figure 13:
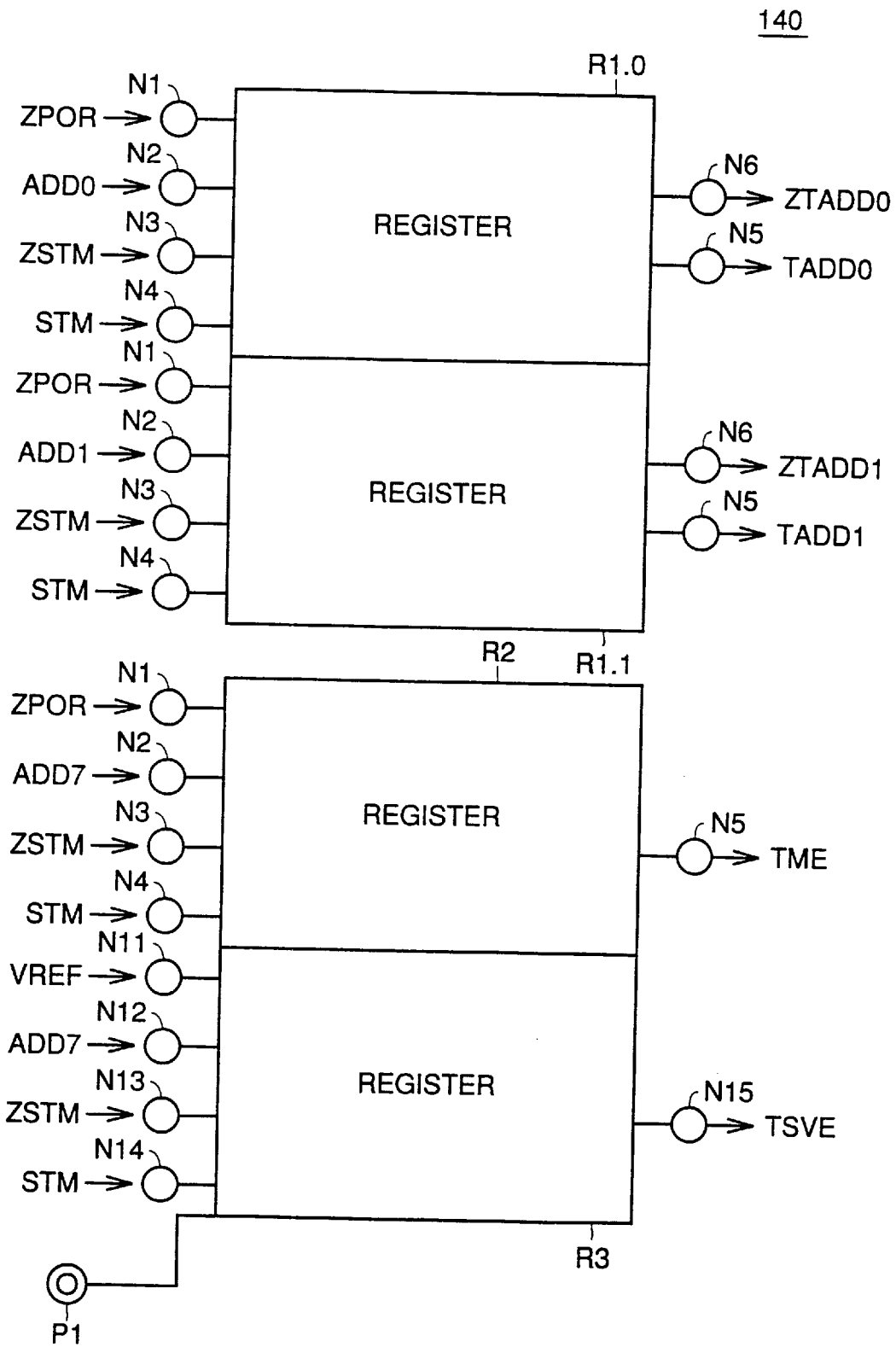
FIG. 13 shows a structure of a test mode register 140 shown in FIG. 12 and an example of relation between inputs and outputs of the register.

Test mode register 140 shown in FIG. 13 includes register R1.0 corresponding to address signal ADD0, register R1.1 corresponding to address signal ADD1, register R2 as a first enabler (corresponding to address signal ADD7), and register R3 as a se co nd enabler (corresponding to address signal ADD7 and input pad P1). Structures of registers R1.0, R1.1 and R2 is as described with reference to FIG. 25 of the prior art example.

Circuit structure and the relation between inputs and outputs of register R3 shown in FIG. 13 will be described with reference to FIG. 14.

Figure 14:
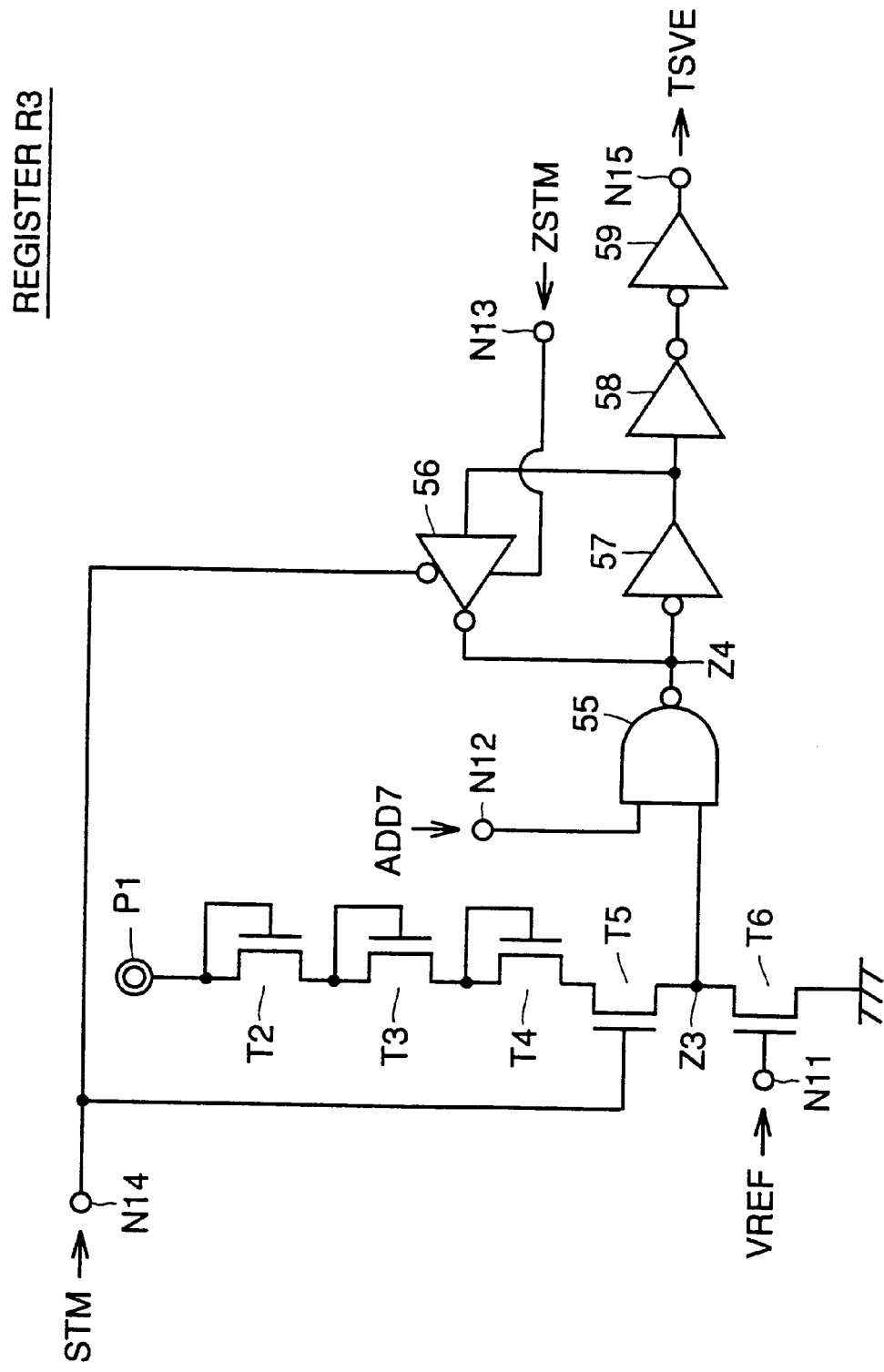
FIG. 14 shows a structure of a register R3 shown in FIG. 13 and an example of relation between inputs and outputs of the register.

Register R3 shown in FIG. 14 includes N channel MOS transistors T2, T3, T4, T5 and T6, an NAND circuit 55, a gate circuit 56 and inverter circuits 57, 58 and 59.

Transistors T2, T3, T4 and T5 are connected in series between input pad P1 and node Z3. Transistor T6 is connected between node Z3 and ground potential GND. Gate electrode of transistor T6 is connected to input node N11. Gate electrode of transistor T5 is connected to input node N14.

NAND circuit 55 receives an input signal from input node N12 and a signal at node Z3, and outputs a signal to a node Z4. Inverter circuit 57 inverts the output signal from node Z4 and outputs the resulting signal. Gate circuit 56 inverts an output signal from inverter circuit 57 and outputs the resulting signal to node Z4, in response to signals at input nodes N13 and N14. Inverter circuit 58 inverts an output signal from inverter circuit 57 and outputs the resulting signal to inverter circuit 59. Inverter circuit 59 inverts an output signal from inverter circuit 58 and outputs the resulting signal to output node N15.

More specifically, as shown in FIG. 14, a reference voltage VREF is applied to node N11 and address signal ADD7 is applied to input node N12 in test mode register 140. Further, the inverted test mode set signal ZSTM is applied to input node N13 and the test mode set signal STM is applied to input node N14. The special test enable signal TSVE is output from output node N15.

An example of a circuit structure of test mode decoder 142 shown in FIG. 12 will be described with reference to FIG. 15.

Figure 15:
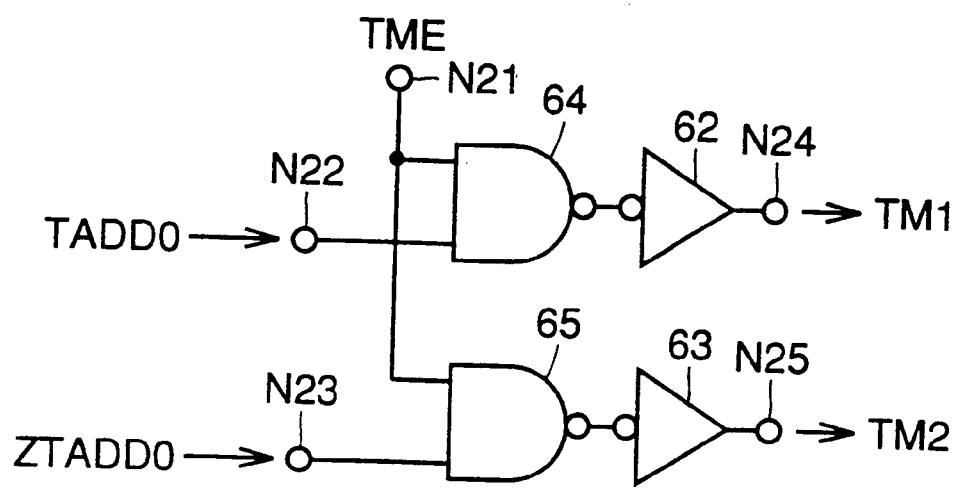
FIG. 15 is a schematic diagram showing an example of a decoder D1 constituting test decoder 142 shown in FIG. 12.
Figure 15:
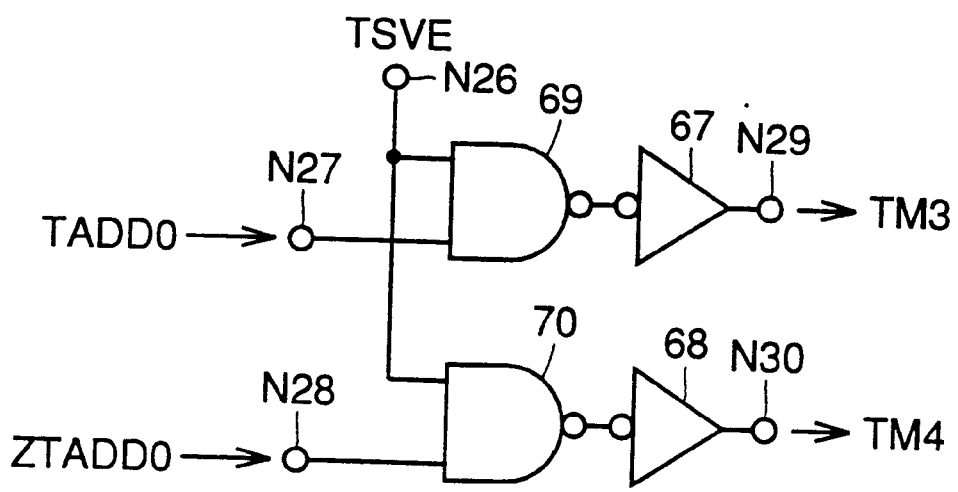

FIG. 15 shows a structure of decoder D1 corresponding to the signal TADD0 included in test mode decoder 142 and relation between inputs and outputs thereof.

Decoder D1 includes NAND circuits 64 and 65, and inverter circuits 62 and 63. NAND circuit 64 receives signals from input nodes N21 and N22 and outputs a signal to inverter circuit 62. Inverter circuit 62 inverts this signal and outputs the resulting signal to output node N24. NAND circuit 65 receives signals from input nodes N21 and N23 and outputs a signal to inverter circuit 63. Inverter circuit 63 inverts this signal and outputs the resulting signal to an output node N25.

Decoder D1 further includes NAND circuits 69 and 70 and inverter circuits 67 and 68. NAND circuit 69 receives signals from input nodes N26 and N27 and outputs a signal to inverter circuit 67. Inverter circuit 67 inverts this signal and outputs the resulting signal to an output node N29. NAND circuit 70 receives signals from input nodes N26 and N28, and outputs a signal to inverter circuit 68. Inverter circuit 68 inverts this signal and outputs the resulting signal to output node N30.

More specifically, referring to FIG. 15, the signal TADD0 is applied to input nodes N22 and N27, the signal ZTADD0 is applied to input nodes N23 and N28, and the test mode enable signal TME is applied to input node N21 in decoder D1 corresponding to the signal TADD0. When the test mode enable signal TME is at the H level, the test mode signal TM1 is output from output node N24, or the test mode signal TM2 is output from output node N25.

The special test mode enable signal TSVE is applied to input node N26. When the special test mode enable signal TSVE is at the H level, the test mode signal TM3 is output from output node N29, or the test mode signal TM4 is output from output node N30.

The decoder corresponding to the signal TADD1 has similar circuit structure as decoder D1, in which signal TADD1 is applied to input nodes N22 and N27, signal ZTADD1 is applied to input nodes N23 and N28, and the test mode enable signal TME is applied to input node N21. When the test mode enable signal TME is at the H level, the corresponding test mode signal is output from output node N24 or N25.

The special test mode enable signal TSVE is applied to input node N26. When the special test mode enable signal TSVE is at the H level, the corresponding test mode signal is output from output node N29 or N30.

The operation of synchronous semiconductor memory device 6000 shown in FIG. 12 will be described with reference to the time chart of FIG. 16.

Figure 16:
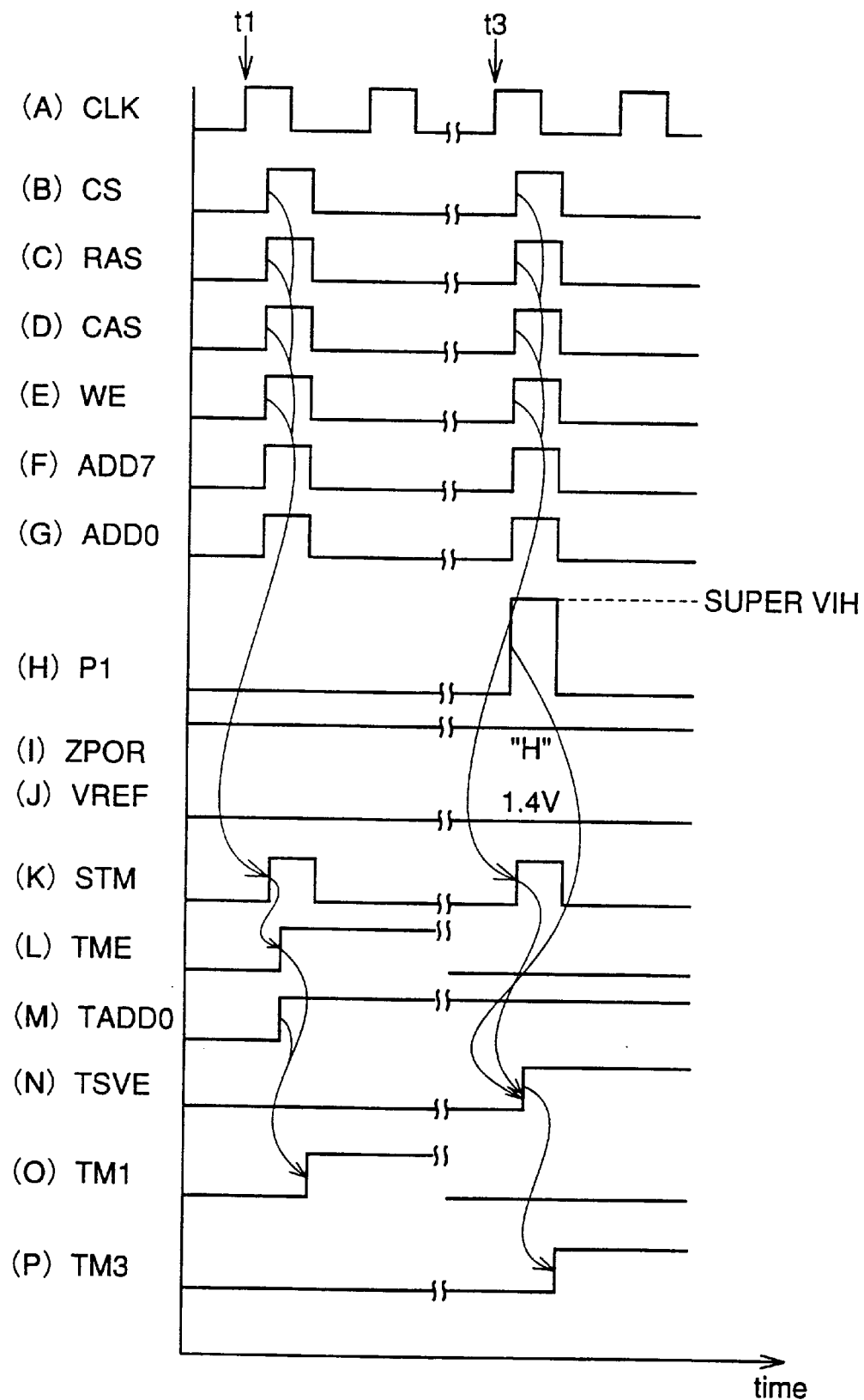
FIG. 16 is a timing chart related to the operation of the synchronous semiconductor memory device 6000 in accordance with the sixth embodiment of the present invention.

In FIG. 16, (A) represents internal clock signal CLK, (B) represents internal control signal CS, (C) internal control signal RAS, (D) internal control signal CAS and (D) internal control signal WE. Further, (F) represents address signal ADD7, (G) address signal ADD0, (H) a voltage level at input pad P1, (I) power on reset signal ZPOR and (J) the reference voltage VREF. Further, (K) represents the test mode set signal STM, (L) test mode enable signal TME, (M) the signal TADD0, (N) special test mode enable signal TSVE, (O) test mode signal TM1 and (P) test mode signal TM3, respectively. In the following, it is assumed that address signal ADD0 is at the H level and address signal ADD1 is at the L level.

First, an operation of entering a test mode in response to the mode register set command and address signal ADD7 which is at the H level will be described.

When the mode register set command (internal control signals CS, RAS, CAS and WE all being at the H level) is input at time t1, test mode set signal STM attains to the H level.

Since address signal ADD7 is at the H level at this time point, the test mode enable signal TME at the H level is output from register R2. Decoder D1 receives test mode enable signal TME at the H level and the signal TADD0 at the H level, and outputs (selects) the test mode signal TM1 at the H level. The content of the test mode register is latched until an input of the next mode register set command.

An operation of entering a special test mode in response to a high voltage (super VIH) input to input pad P1 will be described.

Simultaneously with the input of the mode register set command, the super VIH (high voltage) is applied to input pad P1. Consequently, the special test mode enable signal TSVE at the H level is output from register R3.

Decoder D1 receives the special test mode enable signal TSVE at the H level and the signal TADD0 at the H level, and selects test mode signal TM3 and sets test mode signal TM1 to the non-selected state.

In this manner, synchronous semiconductor memory device 6000 in accordance with the sixth embodiment of the present invention enters a test mode (corresponding to the test mode signal TM1 or TM2) based on the mode register set command and the address signal, and it enters a special test mode (for example, one corresponding to test mode signal TM3 or TM4) when the super VIH condition is satisfied. As a result, possibility of a user's erroneously entering a special test mode (especially, a test requiring much time for resetting) is almost eliminated.

Seventh Embodiment

The synchronous semiconductor memory device in accordance with the seventh embodiment of the present invention has a plurality of input pads to which a high power supply voltage is applied, allowing entrance to a special test mode in accordance with the combination of the pads. Therefore, various test modes can be performed utilizing combination of super VIH conditions and in the actual use, possibility of erroneous entrance to the test mode can be reduced.

An overall structure of a synchronous semiconductor memory device 7000 in accordance with the seventh embodiment of the present invention will be described with reference to FIG. 17. Similar components as those of the conventional synchronous semiconductor memory device 9000 will be denoted by the same reference characters and description thereof is not repeated.

Figure 17:
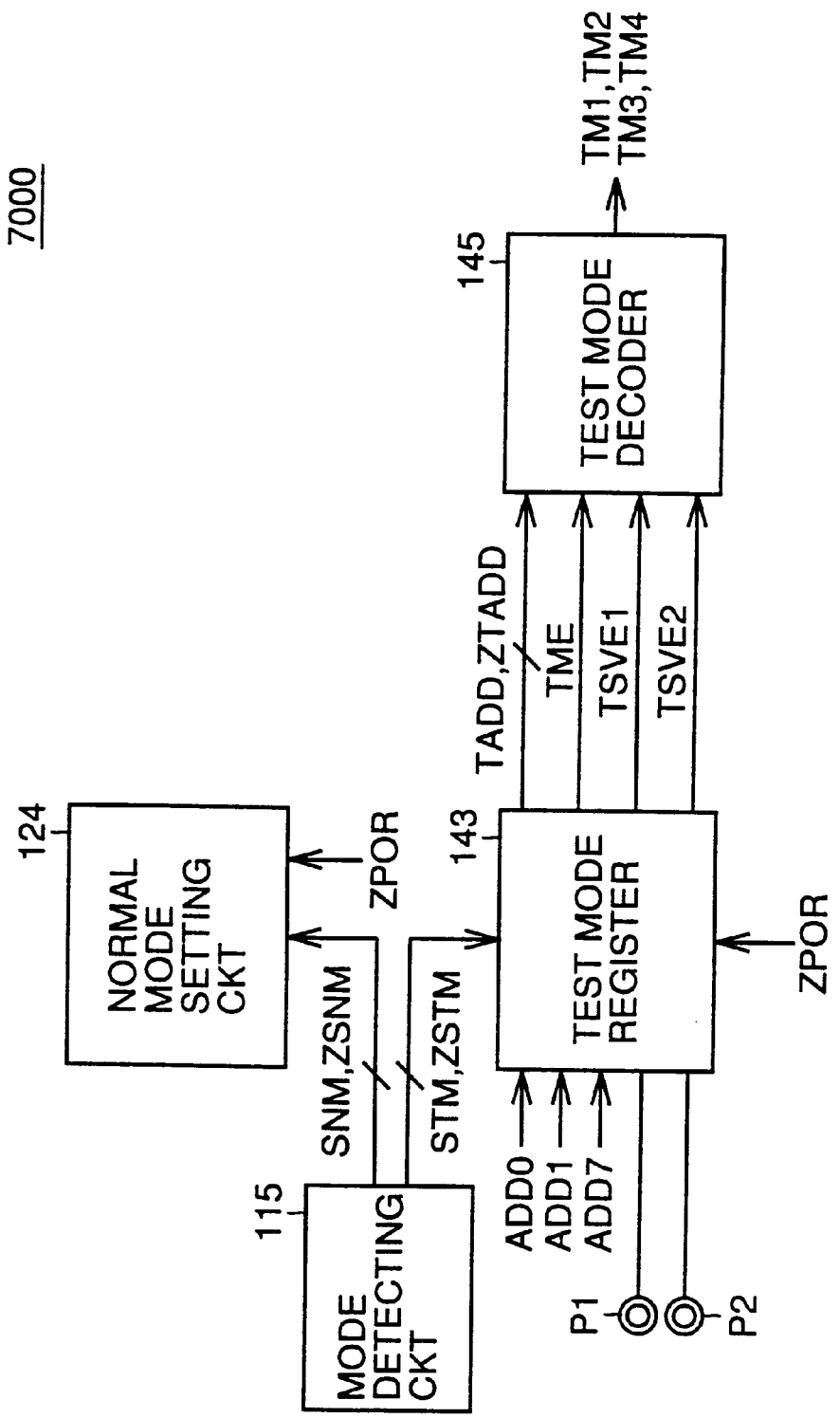
FIG. 17 shows an example of a structure of a main portion of a synchronous semiconductor memory device 7000 in accordance with a seventh embodiment of the present invention.

Synchronous semiconductor memory device 7000 shown in FIG. 17 includes a test mode register 143 and a test mode decoder 145.

Different from test mode register 140 in accordance with the sixth embodiment, test mode register 143 outputs a first special test mode enable signal TSVE1 and a second special test mode enable signal TSVE2 in accordance with signals at input pads P1 and P2, respectively.

The structure and relation between inputs and outputs of test mode register 143 shown in FIG. 17 will be described with reference to FIG. 18.

Figure 18:
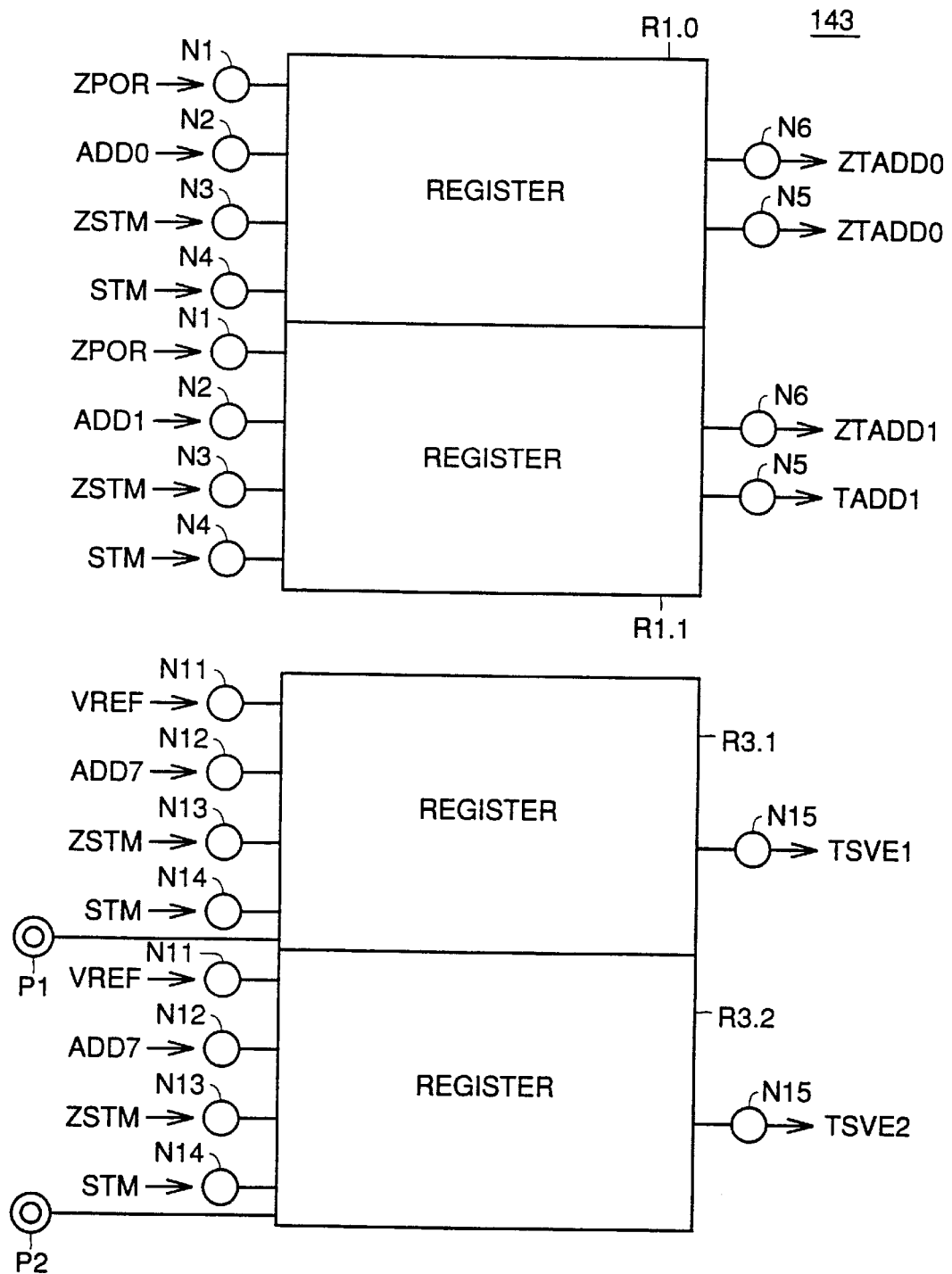
FIG. 18 shows a structure of a test mode register 143 shown in FIG. 17 and an example relation between of inputs and outputs of the register.

FIG. 18 shows the structure and relation between inputs and outputs of test mode register 143 shown in FIG. 17. Test mode register 143 shown in FIG. 18 includes register R1.0 corresponding to address signal ADD0, register R1.1 corresponding to address signal ADD1, register R3.1 as a first enabler (corresponding to address signal ADD7 and input pad P1) and register R3.2 as a second enabler (corresponding to address signal ADD7 and input pad P2).

Registers R3.1 and R3.2 are represented by register R3 shown in FIG. 14 which receives at input node N11, reference voltage VREF, at input node N12, address signal ADD7, at input node N13, inverted test mode set signal ZSTM and at input node N14, the test mode set signal STM.

Register R3.1 receives a signal from input pad P1. The first special test mode enable signal TSVE1 is output from output node N15 of register R3.1.

Register R3.2 receives a signal from input pad P2. The second special test mode enable signal TSVE2 is output from output node N15 of register R3.2.

The structure and relation between inputs and outputs of test mode decoder 145 shown in FIG. 17 will be described with reference to FIG. 19.

Figure 19:
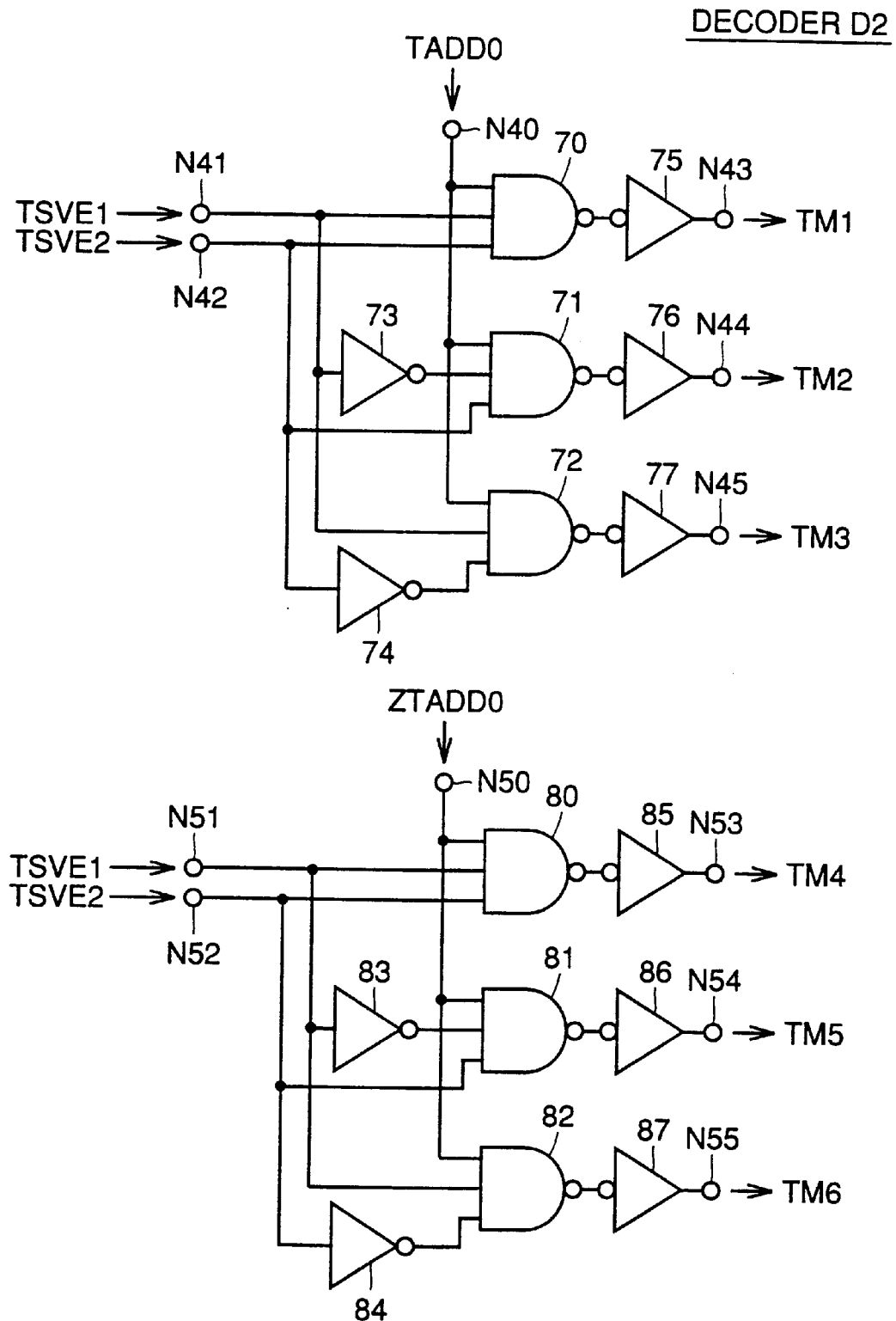
FIG. 19 shows a structure of a decoder D2 included in test mode decoder 145 shown in FIG. 17 and an example of relation between inputs and outputs thereof.

FIG. 19 shows the structure and relation between inputs and outputs of decoder D2 included in test mode decoder 145 shown in FIG. 17. FIG. 19 shows the structure and relation between inputs and outputs of decoder D2 which corresponds to the signal TADD0.

Decoder D2 includes NAND circuits 70, 71, 72, 80, 81 and 82, and inverter circuits 73, 74, 75, 76, 77, 83, 84, 85, 86 and 87.

NAND circuit 70 receives signals from input nodes N40, N41 and N42, and outputs a signal to inverter circuit 75. Inverter circuit 75 inverts this signal and outputs the resulting signal to output node N43. NAND circuit 71 receives a signal at input node N40, the signal at input node N41 inverted by inverter circuit 73 and a signal at input node N42, and outputs a signal to inverter circuit 76. Inverter circuit 76 inverts this signal and outputs the resulting signal to output node N44. NAND circuit 72 receives signals from input nodes N40 and N41 and a signal from input node N42 inverted by inverter circuit 74, and outputs a signal to inverter circuit 77. Inverter circuit 77 inverts this signal and outputs the resulting signal to output node N45.

NAND circuit 80 receives signals from input nodes N50, N51 and N52, and outputs a signal to inverter circuit 85. Inverter circuit 85 inverts this signal and outputs the resulting signal to output node N53. NAND circuit 81 receives signals at input nodes N50 and N52, and receives a signal from input node N51 inverted by inverter circuit 83. Inverter circuit 86 inverts an output signal from NAND circuit 81 and outputs the resulting signal to output node N54. NAND circuit 82 receives signals from input nodes N50 and N51, and a signal from input node N52 inverted by inverter circuit 84. Inverter circuit 87 inverts an output signal from NAND circuit 82 and outputs the resulting signal to output node N55. The decoder corresponding to the signal TADD1 has similar circuit structure as decoder D2.

Decoder D2 corresponding to signal TADDi (where i=0 or 1) receives at input node N40, the signal TADDi, at input nodes N41 and N51, the first special test mode enable signal TSVE1, and at input nodes N42 and N52, the second special test mode enable signal TSVE2. Further, it receives at input node N50, the inverted signal ZTADDi.

Decoder D2 corresponding to signal TADD0 outputs, from output node N43, test mode signal TM1, from output node N44, test mode signal TM2, from output node N45, test mode signal TM3, from output node N53, test mode signal TM4, from output node N54, test mode signal TM5, and from output node N55, test mode signal TM6.

The decoder corresponding to address signal ADD1 outputs, in response to the signal TADD1, the inverted signal ZTADD1 and the special test mode enable signals TSVE1 and TSVE2, a corresponding test mode signal.

The operation of synchronous semiconductor memory device 7000 in accordance with the seventh embodiment of the present invention shown in FIG. 17 will be described with reference to the time chart of FIG. 20.

Figure 20:
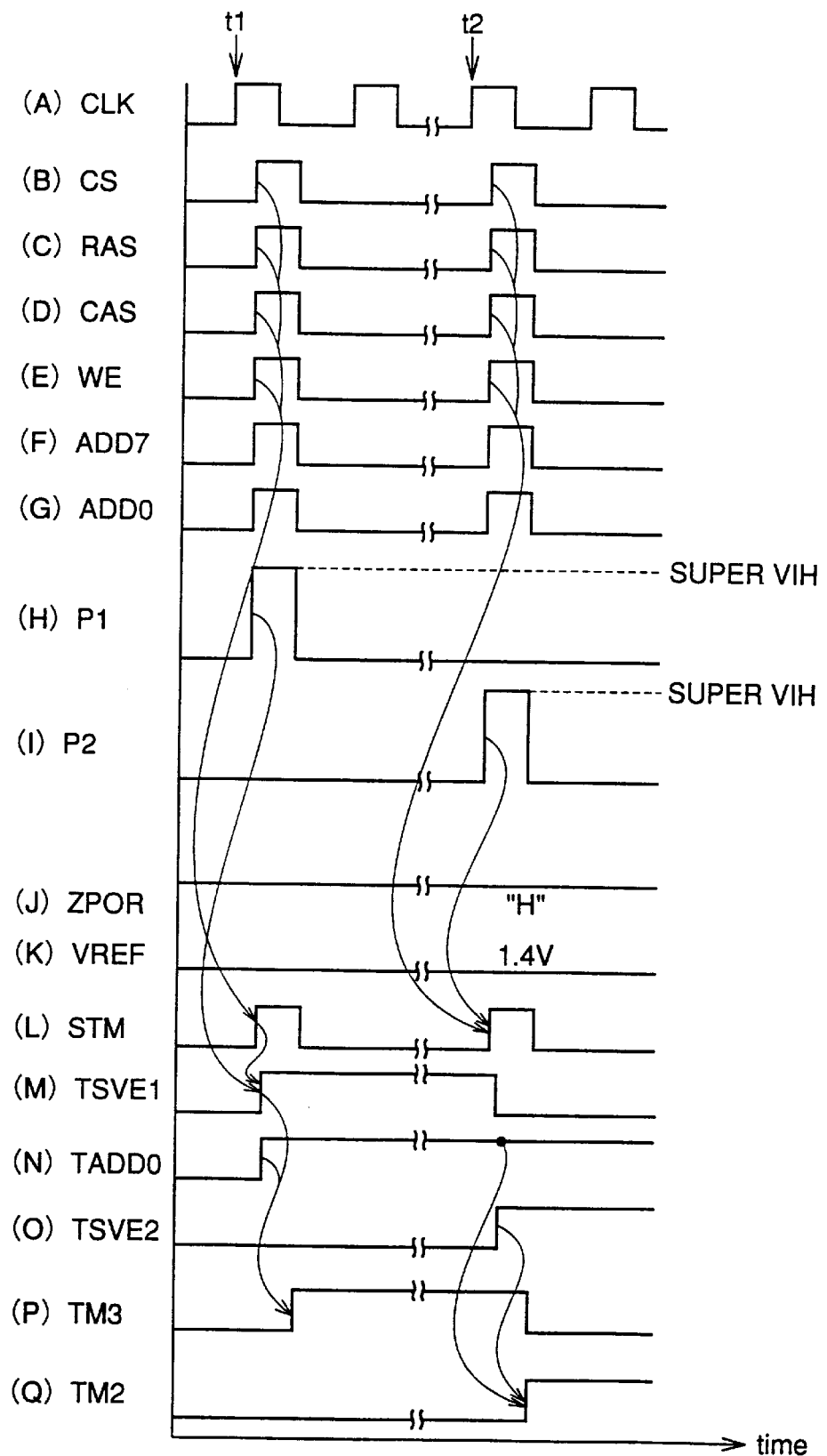
FIG. 20 is a timing chart showing an operation of synchronous semiconductor memory device 7000 in accordance with the seventh embodiment of the present invention.
Figure 21:
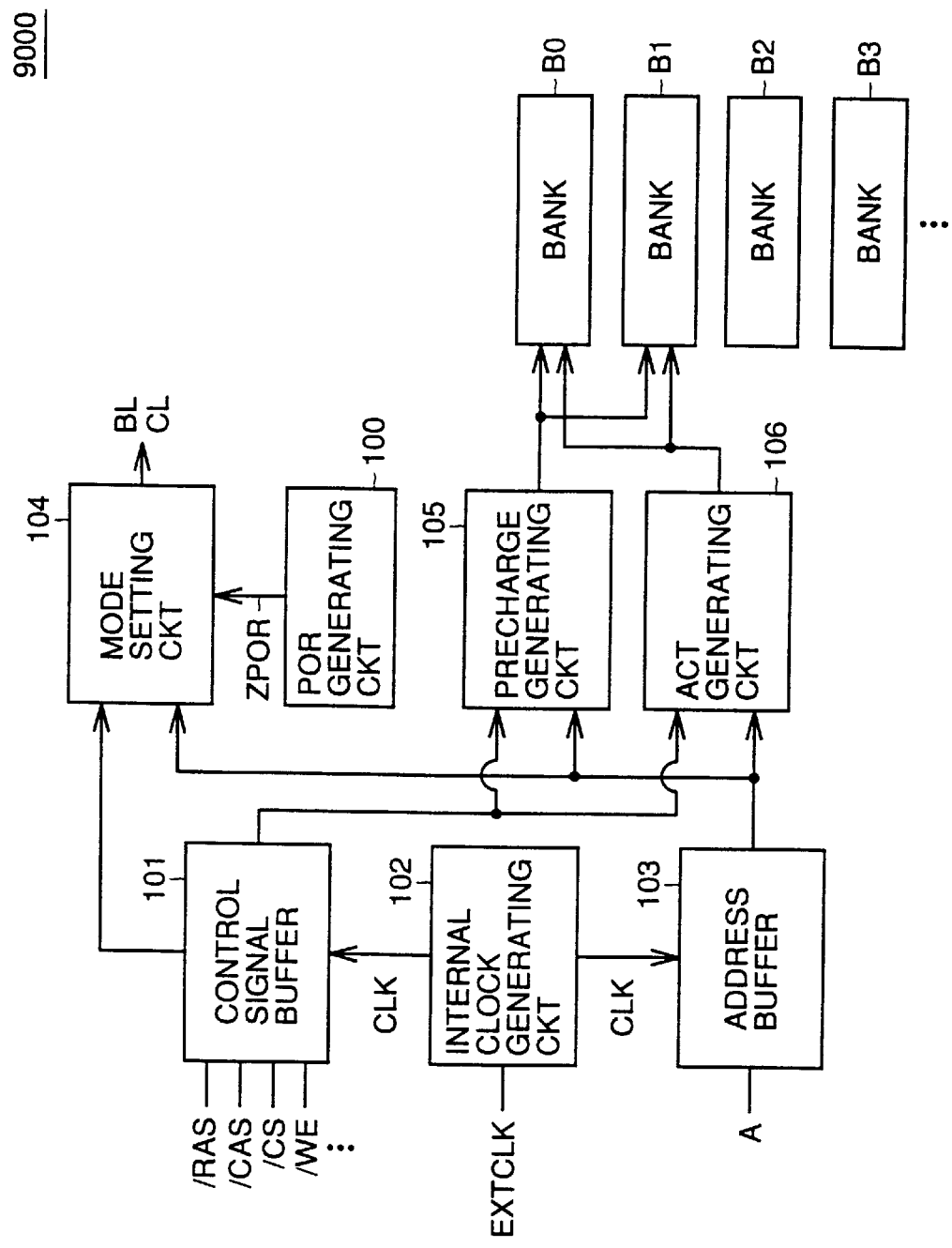
FIG. 21 is a schematic block diagram showing a structure of a main portion of a conventional synchronous semiconductor memory device 9000.

In FIG. 20, (A) represents internal clock signal CLK, (B) internal control signal CS, (C) internal control signal RAS, (D) internal control signal CAS, (E) represents internal control signal WE, (F) represents address signal ADD7, (G) represents address signal ADD0, (H) represents voltage level of input pad P1 and (I) voltage level of input pad P2, respectively. Further, (J) represents power on reset signal ZPOR, (K) reference voltage VREF, (L) test mode set signal STM, (M) the first special test mode enable signal TSVE1, (N) signal TADD0, (O) the second special test mode enable signal TSVE2, (P) test mode signal TM3 and (Q) the test mode signal TM2, respectively.

When mode register set command MRS is input at time t1, address signal ADD7 is at the H level, and super VIH level voltage is input to input pad P1. Consequently, the first special test mode enable signal TSVE1 attains to the H level. By the combination with the signal TADD0, test mode signal TM3 is selected.

At time t2, mode register set command MRS is again input. At this time, address signals ADD7 and ADD0 are both set to the H level and, at the same time, super VIH level voltage is applied to input pad P2.

In this case, the first test mode enable signal TSVE1 attains to the L level and the second special test mode enable signal TSVE2 attains to the H level. Consequently, by the combination with the signal TADD0, test mode signal TM2 is selected and test mode signal TM3 is set to the non-selected state.

In this manner, by using a plurality of super VIH input pads, combination of address signals can be reduced in number. Further, since super VIH condition is used, possibility of users erroneous entrance to the test mode can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device, comprising:

a plurality of banks each including a memory cell array with a plurality of memory cells arranged in a matrix of rows and columns, and a plurality of word lines provided corresponding to the rows of said memory cell array;

internal clock generating means for outputting an internal clock signal synchronized with an external clock signal;

normal mode setting means responsive to a mode setting command and an external signal input in synchronization with said internal clock signal for outputting a normal mode signal indicating designation of a prescribed operation mode;

test mode setting means responsive to said mode setting command and a test mode designating signal input in synchronization with said internal clock signal, for detecting designation of a prescribed test mode and outputting, as a result of detection, at least one test mode signal; and reset signal generating means responsive to an initialize command for initializing said banks input in synchronization with said internal clock signal after power on, for outputting a reset signal; wherein said test mode setting means receives said reset signal and inactivates at least one said test mode signal.

2. The synchronous semiconductor memory device according to claim 1, wherein said initialize command is a precharge command for inactivating a corresponding one of said banks.

3. The synchronous semiconductor memory device according to claim 1, wherein said test mode designating signal includes a first test mode designating signal and a second test mode designating signal;

said test mode setting means includes detecting means responsive to said mode setting command for detecting designation of said test mode, latch means responsive to detection of designation of said test mode by said detecting means for latching said second test mode designating signal, decoding means for decoding an output from said latch means for selectively activating corresponding one of said at least one test mode signal, and control means responsive to detection of designation of said test mode by said detecting means for generating an enable signal for activating operation of said decode means based on said first test mode designating signal; and said control means inactivates said enable signal and inactivates operation of said decode means, in response to said reset signal.

4. The synchronous semiconductor memory device according to claim 1, wherein said test mode setting means includes detecting means responsive to said mode setting command for detecting designation of said test mode, latch means responsive to detection of designation of said test mode by said detecting means for latching and outputting said test mode designating signal, and decode means for decoding an output from said latch means for selectively activating corresponding one of said at least one test mode signal; and said latch means inactivates said latched test mode designating signal in response to said reset signal.

5. The synchronous semiconductor memory device according to claim 1, wherein said test mode designating signal includes a first test mode designating signal, and a second test mode designating signal;

said test mode setting means includes detecting means responsive to said mode setting command for detecting designation of said test mode, decode means for decoding said second test mode designating signal, latch means responsive to detection of designation of said test mode by said detecting means for latching an output of said decode means for selectively activating and outputting corresponding one of said at least one test mode signal, and control means responsive to detection of designation of said test mode by said detecting means, for generating an enable signal for activating said output operation of said latch means based on said first test mode designating signal; and said control means inactivates said enable signal and inactivates said output operation of said latch means, in response to said reset signal.

6. The synchronous semiconductor memory device according to claim 1, wherein said test mode setting means includes detecting means responsive to said mode setting command for detecting designation of said test mode, decode means for decoding said test mode designating signal, and latch means responsive to detection of designation of said test mode by said detecting means for latching an output of said decode means and selectively activating and outputting corresponding one of said at least one test mode signal; and said latch means inactivates said latched output of said decode means and inactivates said test mode signal, in response to said reset signal.

7. The synchronous semiconductor memory device according to claim 1, further comprising a plurality of internal circuits each operating in response to said at least one test mode signal; wherein said test mode setting means includes detecting means responsive to said mode setting command for detecting designation of said test mode, selecting means responsive to detection of designation of said test mode by said detecting means, for selectively outputting one of said at least one test mode signal corresponding to said test mode designating signal, and means for resetting that one of said at least one test mode signals which is input to a specific one of said plurality of internal circuits among said test mode signals output from said selecting means, in response to said reset signal, and outputting said reset test mode signal to said specific internal circuit.

8. A synchronous semiconductor memory device, comprising:

a plurality of banks each including a memory cell array with a plurality of memory cells arranged in a matrix of rows and columns, and a plurality of word lines provided corresponding to the rows of said memory cell array;

internal clock generating means for outputting an internal clock signal synchronized with an external clock signal;

command detecting means responsive to a first command input in synchronization with said internal clock signal for outputting a first command correspondence signal indicating input of said first command;

test mode detecting means responsive to a test mode designating signal input in synchronization with said internal clock for detecting designation of a test mode;

converting means responsive to detection of designation of said test mode by said test mode detecting means, for converting said first command correspondence signal to a second command correspondence signal corresponding to a second command different from the first command; and executing means responsive to said second command correspondence signal for executing an operation corresponding to said second command.

9. The synchronous semiconductor memory device according to claim 8, wherein said second command correspondence signal includes a plurality of said second command correspondence signals;

said executing means is provided for each of said plurality of second command correspondence signals; and said converting means selectively outputs a prescribed one of said plurality of second command correspondence signals in response to said first command correspondence signal and a plurality of external signals input in synchronization with said internal clock signal.

10. The synchronous semiconductor memory device according to claim 9, further comprising:

test mode setting means responsive to detection of designation of said test mode by said test mode detecting means, for outputting at least one test mode signal as a result of detection; and reset signal generating means for outputting a reset signal in response to said second command input after power on; wherein said test mode setting means inactivates at least one said test mode signal upon reception of said reset signal.

11. The synchronous semiconductor memory device according to claim 9, wherein said plurality of external signals are a plurality of address signals.

12. The synchronous semiconductor memory device according to claim 9, further comprising reading means for reading and externally outputting data from a memory cell of any of said plurality of banks; wherein said first command is a burst terminate command inhibiting external output of said data read from corresponding one of said banks.

13. A synchronous semiconductor memory device, comprising:

an input pad;

a plurality of banks each including a memory cell array with a plurality of memory cells arranged in a matrix of rows and columns, and a plurality of word lines provided corresponding to the rows of said memory cell array;

internal clock generating means for outputting an internal clock signal synchronized with an external clock signal;

normal mode setting means responsive to a mode setting command and an external signal input in synchronization with said internal clock signal, for outputting a normal mode signal indicating designation of a prescribed operation mode; and test mode setting means responsive to said mode setting command and a test mode designating signal input in synchronization with said internal clock signal, and a voltage at the input pad for outputting at least one test mode signal indicating designation of a prescribed test mode; wherein said test mode designating signal includes a first test mode designating signal, and a second test mode designating signal;

said test mode setting means includes detecting means responsive to said mode setting command for detecting designation of said test mode, first selecting means responsive to detection of designation of said test mode by said detecting means, for selectively activating one of said at least one test mode signal corresponding to said second test mode designating signal, and first control means responsive to detection of designation of said test mode by said detecting means, for outputting a first enable signal for enabling operation of said first selecting means based on said first test mode designating signal and a signal at least twice an external power supply voltage input from said input pad.

14. The synchronous semiconductor memory device according to claim 13, wherein said test mode setting means includes second selecting means responsive to detection of designation of said test mode by said detecting means, for selectively activating said at least one test mode signal corresponding to said second test mode designating signal, and second control means responsive to detection of designation of said test mode by said detecting means, for outputting a second enable signal for enabling operation of said second selecting means based on said first test mode designating signal.

15. The synchronous semiconductor memory device according to claim 13, wherein said input pad includes a plurality of said input pads;

said first control means is provided corresponding to each of said plurality of input pads; and said first selecting means outputs, responsive to combination of enable signals output from respective ones of said first control means, a corresponding one of said at least one test mode signal based on said second test mode designating signal.

* * * * *